(12) United States Patent
Akizuki et al.

(10) Patent No.: US 9,748,909 B2
(45) Date of Patent: Aug. 29, 2017

(54) OUTPUT CONTROL CIRCUIT

(71) Applicant: Panasonic Intellectual Property Management Co., Ltd., Osaka (JP)

(72) Inventors: Taiji Akizuki, Miyagi (JP); Takahiro Shima, Kanagawa (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 15/179,977

(22) Filed: Jun. 11, 2016

(65) Prior Publication Data

US 2017/0005631 A1 Jan. 5, 2017

(30) Foreign Application Priority Data

Jul. 1, 2015 (JP) ................. 2015-132798

(51) Int. Cl.
*H03F 3/19* (2006.01)
*H04B 1/16* (2006.01)
*H03F 1/30* (2006.01)
*H03G 3/30* (2006.01)
*H03G 7/08* (2006.01)
(Continued)

(52) U.S. Cl.
CPC .............. *H03F 3/19* (2013.01); *H03F 1/30* (2013.01); *H03F 3/195* (2013.01); *H03F 3/245* (2013.01); *H03G 3/3042* (2013.01); *H03G 7/08* (2013.01); *H04B 1/16* (2013.01); *H03F 2200/204* (2013.01); *H03F 2200/207* (2013.01); *H03F 2200/405* (2013.01); *H03F 2200/408* (2013.01); *H03F 2200/447* (2013.01); *H03F 2200/451* (2013.01); *H03F 2200/78* (2013.01); *H04B 2001/0408* (2013.01)

(58) Field of Classification Search
CPC ........................................................ H03F 3/19
USPC ........................................................ 330/278
See application file for complete search history.

(56) References Cited

U.S. PATENT DOCUMENTS 3,386,049 A * 5/1968 Rorden ..................... H03L 7/00
331/1 A
5,177,453 A * 1/1993 Russell .................. H03B 19/18
330/136
(Continued)

FOREIGN PATENT DOCUMENTS

JP 2011-147167 7/2011

*Primary Examiner* — Patricia T Nguyen
(74) *Attorney, Agent, or Firm* — Seed IP Law Group LLP

(57) ABSTRACT

A gain control circuit includes: a gain switching controller that changes the gains of a fundamental frequency amplifier and an N-multiplied frequency amplifier; and a detection voltage comparator that determines whether the operating state of an N-multiplier is a saturated operation or a linear operation. The detection voltage comparator determines the operating state of the N-multiplier by comparing an amount of change in a detection signal (first detection signal) representing a fundamental frequency signal with respect to an amount of change in the gain of the fundamental frequency amplifier with an amount of change in a detection signal (second detection signal) representing a high-frequency signal with respect to the amount of change in the gain of the fundamental frequency amplifier. The gain switching controller adjusts the gains of the fundamental frequency amplifier and the N-multiplied frequency amplifier on the basis of the operating state of the N-multiplier.

8 Claims, 12 Drawing Sheets

(51) Int. Cl.
    *H03F 3/195*     (2006.01)
    *H03F 3/24*     (2006.01)
    *H04B 1/04*     (2006.01)

(56) References Cited

U.S. PATENT DOCUMENTS

| | | | | |
|---|---|---|---|---|
| 5,469,115 | A * | 11/1995 | Peterzell | H03G 3/3089 |
| | | | | 330/129 |
| 5,617,060 | A * | 4/1997 | Wilson | H03D 3/002 |
| | | | | 330/129 |
| 6,344,778 | B1 * | 2/2002 | Nakamura | H03B 5/24 |
| | | | | 331/108 B |
| 7,433,658 | B1 * | 10/2008 | Shirvani-Mahdavi | |
| | | | | H03G 3/3042 |
| | | | | 455/115.1 |
| 2001/0007151 | A1 * | 7/2001 | Vorenkamp | H01F 17/0006 |
| | | | | 725/151 |
| 2007/0243846 | A1 | 10/2007 | Kirisawa | |
| 2008/0225174 | A1 * | 9/2008 | Greggain | H04N 5/46 |
| | | | | 348/572 |

* cited by examiner

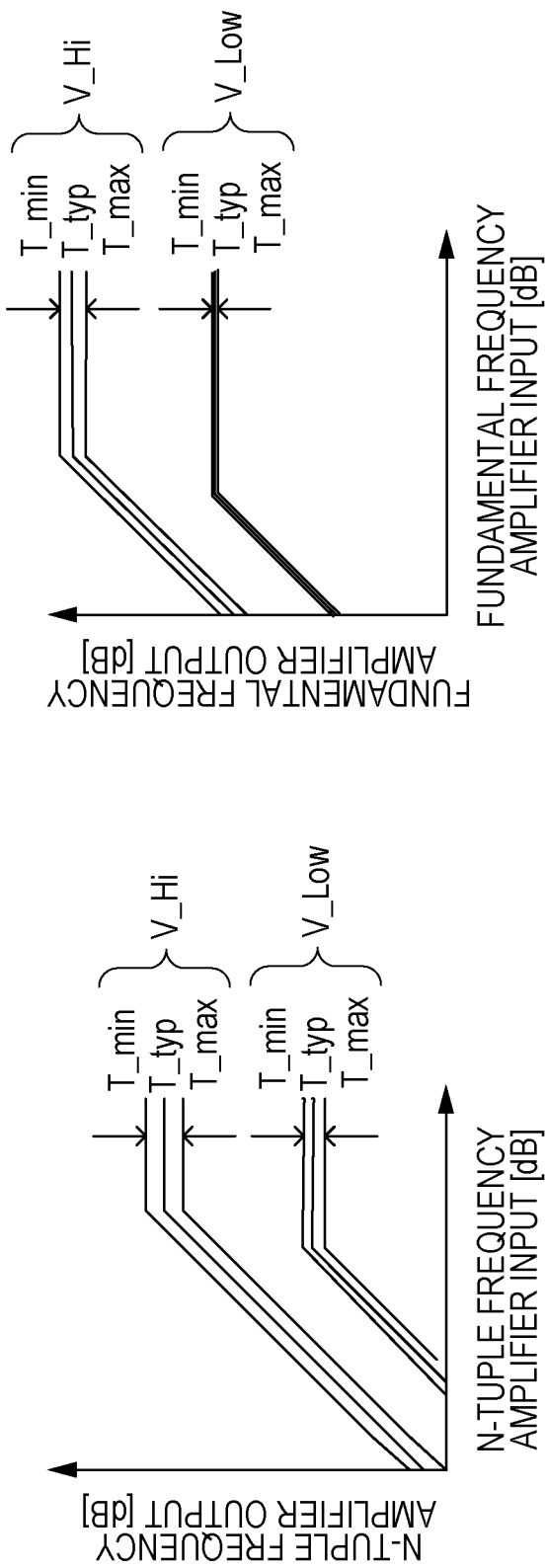

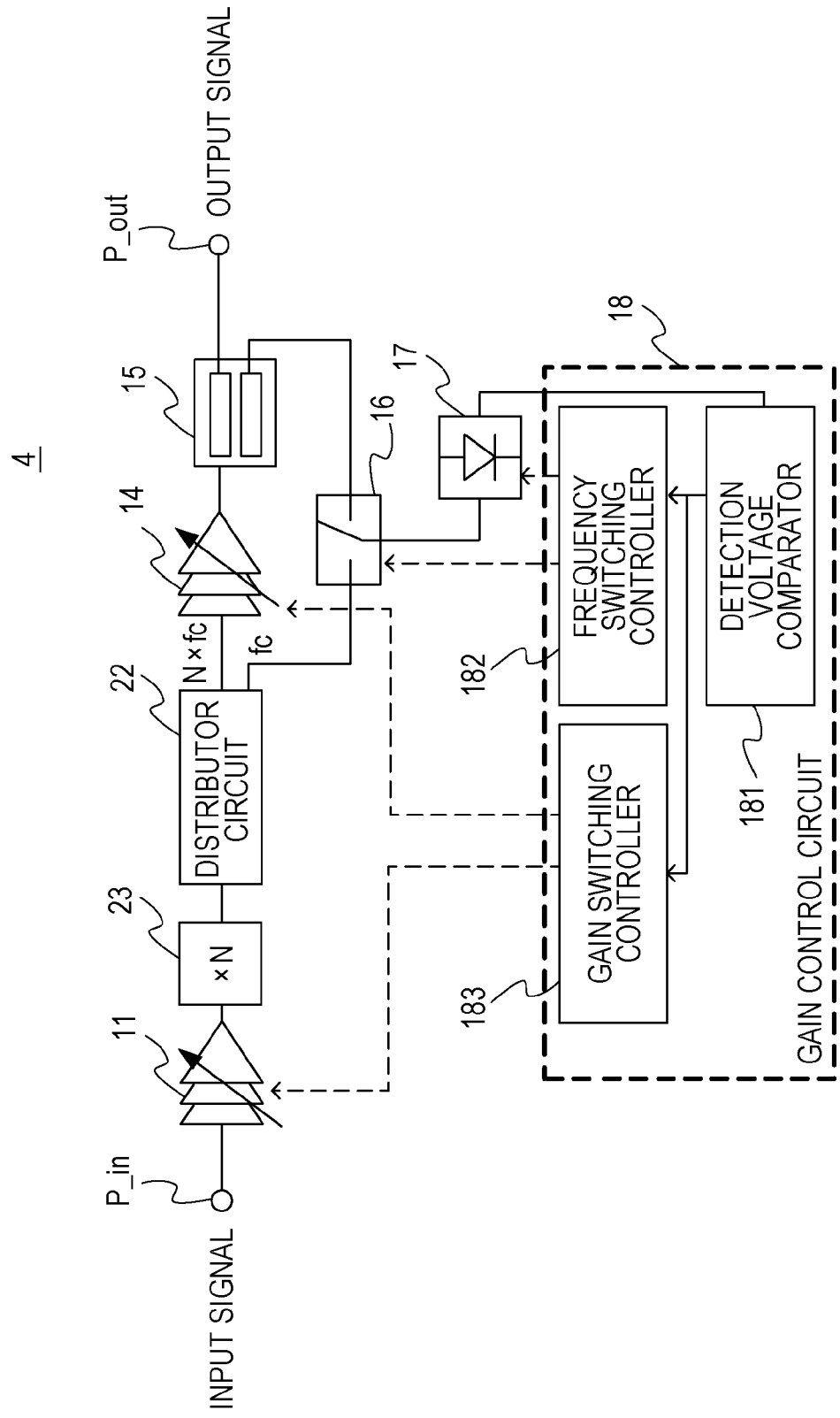

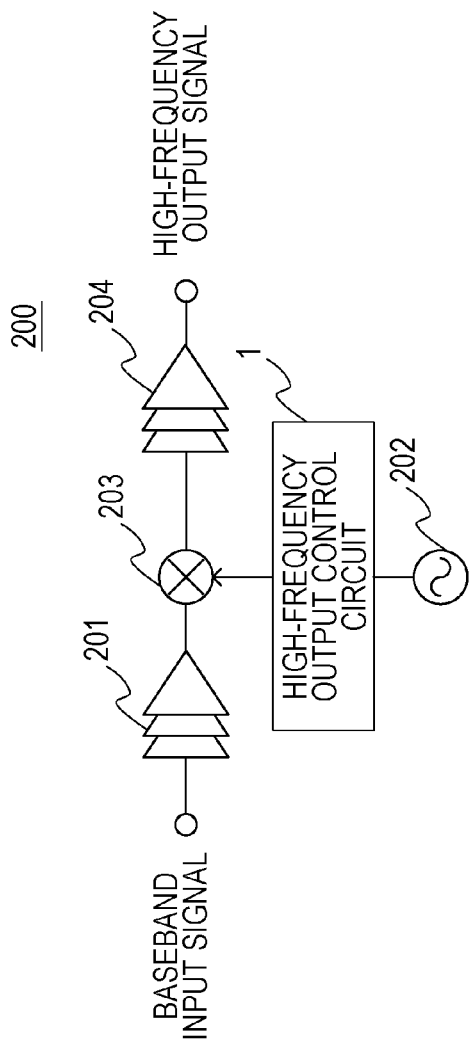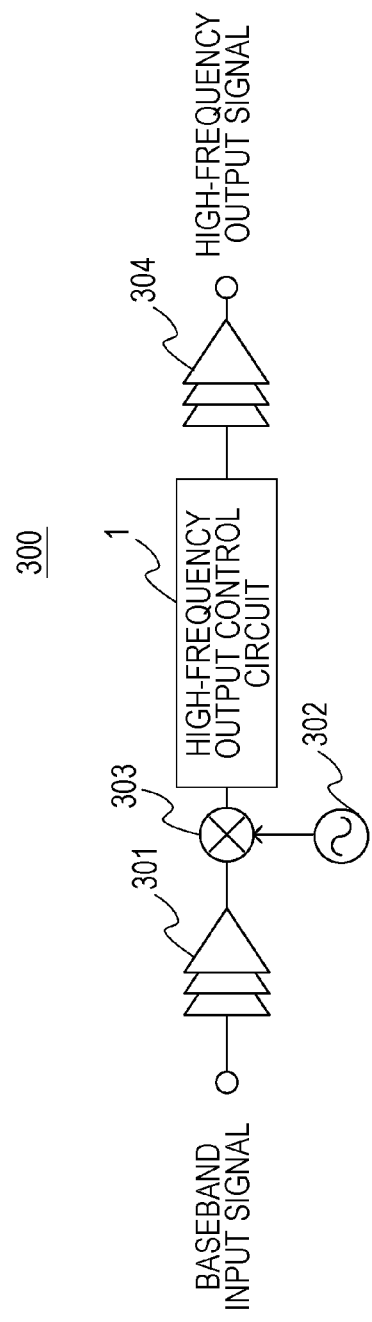

OUTPUT CONTROL CIRCUIT

BACKGROUND

1. Technical Field

The present disclosure relates to an output control circuit that performs feedback control through detection and generates a high-frequency output signal (radio frequency output signal).

2. Description of the Related Art

Recently, in high-speed transmission wireless communication, wireless communications devices transmit and receive high-frequency signals, i.e., signals in a high-frequency band, using a higher frequency band (e.g., a high-frequency band of 60 GHz or higher such as a millimeter-wave band) in order to perform faster transmission while ensuring a frequency band of modulation signals. Further, in the case of performing long-distance wireless communication, the levels of outputs signals need to be held constant both in the transmission characteristic of a transmitter side and the reception characteristic of a receiver side for stable maintenance of high-speed and high-quality communication.

For example, in the case of occurrence of external factors (e.g., temperature change and power supply variation) in the generation of a high-frequency signal, the power of the high-frequency signal needs to be constantly controlled. Therefore, an adjustment method has conventionally been employed that includes providing a detector circuit that detects a change in the power of a high-frequency signal and adjusting, according to a result of the detection by the detector circuit, the gain of a high-frequency amplifier circuit that amplifies the high-frequency signal.

Further, for example, in a case where a direct conversion scheme is used as an RF (radio frequency) configuration in a transmitting device to obtain a high-frequency signal in a high-frequency band such as a millimeter-wave band, an oscillator circuit generates a high-frequency signal in a millimeter-wave band, and the high-frequency signal thus generated is inputted to a mixer circuit. In a case where the oscillator circuit directly generates a high-frequency signal in a millimeter-wave band, the effects of frequency stability, in-band noise, and the like make it difficult for the conventional oscillator circuit to ensure the characteristic of the high-frequency signal. Therefore, a carrier signal in a high-frequency band is generated using an N-multiplier circuit that N-multiplies an input signal. Specifically, the oscillator circuit generates a signal in a low-frequency band (fundamental frequency band) with a good characteristic, and the N-multiplier circuit increases, to an N-multiplied frequency band, the signal in the fundamental frequency band that was generated by the oscillator, and generates a carrier wave in a high-frequency band.

The N-multiplier circuit, which N-multiplies an input signal, has two operation regions. One of the two operation regions is a linear region in which there is a linear relationship between the level of an input signal and the level of an output signal, and the other operation region is a saturation region in which the level of an output signal is saturated with respect to the level of an input signal.

For example, in a case where the oscillator circuit and a 2-multiplier circuit are used to generate a carrier signal in an 80 GHz frequency band, the frequency of a signal that is inputted to the 2-multiplier circuit is 40 GHz. Also, in a case where the oscillator circuit and a 4-multiplier circuit are used to generate a carrier signal in an 80 GHz frequency band, the frequency of a signal that is inputted to the 4-multiplier circuit is 20 GHz. In a case where a signal that is inputted to the N-multiplier circuit is a high-frequency signal, the gain characteristic of a transistor that is used in an input amplifier circuit of the N-multiplier circuit is insufficient. This may result in a greater change in gain characteristic due to external factors (e.g., temperature change and power supply variation) so that the operation region of the N-multiplier circuit may be the linear region. In a case where the N-multiplier circuit operates in the linear region, a variation in the level of a high-frequency signal that is N-multiplied by and outputted from the N-multiplier circuit is N times greater than a variation in the level of a signal that is inputted to the N-multiplier circuit in the N-multiplication settings, and the variation (change) in the output level increases.

This makes it necessary to provide a detector circuit that accurately detects a change in the output level of a high-frequency signal that is outputted from the N-multiplier circuit and to perform feedback control so that the level of the high-frequency signal may become constant. However, in a high-frequency band such as a millimeter-wave band, a source of generation of a reference signal for calibrating the detector circuit operates in the millimeter-wave band, too. This results in a greater variation in the level of the reference signal due to external factors (e.g., temperature change and power supply variation). Furthermore, greater variations in the gain characteristic and sensitivity characteristic of the detector circuit per se, which operates in the millimeter-wave band, make it difficult to detect a change in the output level of the high-frequency signal.

Determination of the operating state (linear operation/saturated operation) of a high-frequency circuit such as the N-multiplier circuit can be made on the basis of the ratio of an output level change (ΔPout) to a constant input level change (ΔPin). For example, in a case where it is desirable that the N-multiplier circuit be controlled as a high-frequency amplifier in a region (saturated operation region) that is equal to or higher than the input level of a 1-dB gain suppression point, determination of the 1-dB gain suppression point (P1 dB) can be made on the basis of ΔPout/ΔPin≤N [dB]. The term "1-dB gain suppression point" here means a point at which the output level drops by 1-dB with respect to the theoretical output level in a case where the amplifier has a linear gain characteristic.

However, in the case of occurrence of a variation in the output level of a high-frequency signal, there is also a greater variation in the output level change (ΔPout), which is a result of detection of an output signal. In a case where the output level change (ΔPout) is 1 [dB] or greater, it is difficult to accurately make determination of the operating state (linear operation/saturated operation) as described above. In a case where accurate determination is not made and the N-multiplier circuit linearly operates due to external factors such as temperature change, the high-frequency signal N-multiplied by the N-multiplier circuit is linearly amplified with respect to the signal that is inputted to the N-multiplier circuit. In this case, the control of gain by the high-frequency amplifier circuit expands the required range of gain control, thus causing an increase in circuit size and an increase in consumption current.

This makes it necessary to reduce variations in the output levels of high-frequency signals due to external factors (e.g., temperature change and power supply variation). For example, Japanese Patent No. 5206828 discloses a control circuit 100 that controls the output level of a high-frequency signal. FIG. 1 schematically shows a configuration of the control circuit 100.

However, with the conventional control circuit 100 described in Japanese Patent No. 5206828, which is shown in FIG. 1, there may be great variations in the gain characteristics of high-frequency amplifiers and the sensitivity characteristics of detector circuits from circuit to circuit due to temperature change. In this case, use of the same temperature correction data that is held by temperature correction controllers leads to greater variations in the levels of high-frequency signals from circuit to circuit. Further, even in the case of acquisition of temperature correction data for each control circuit at the time of initial calibration, changes over time leads to changes in the gain characteristics of the high-frequency amplifiers, thus leading to greater variations in the levels of the high-frequency signals. Therefore, there has been a demand for a countermeasure.

In a circuit that includes an N-multiplier circuit in order to obtain a high-frequency signal and operates in a frequency band, such as a millimeter-wave band, in which there is a great variation in characteristic due to external factors (e.g., temperature change and power supply variation), a configuration in which an N-multiplied high-frequency signal is detected by a detector circuit cannot determine the operation region (linear region, saturation region) of the N-multiplier circuit or control the N-multiplier circuit in the saturated operation region. In a case where the N-multiplier circuit operates in the linear region, a variation in output signal level is N times greater than a variation in input signal level. The expansion in the adjustable range of gain of the high-frequency amplifier causes an increase in circuit size and an increase in consumption current.

SUMMARY

One non-limiting and exemplary embodiment provides an output control circuit that can determine the operating state (saturated operation/linear operation) of an N-multiplier in the case of a variation in the signal level of a high-frequency signal (radio frequency signal) due to external factors (e.g., temperature change and power supply variation) and optimally control the adjustment of the gain of a fundamental frequency amplifier and the gain of an N-multiplied frequency amplifier so that the operating state of the N-multiplier may be the saturated operation.

In one general aspect, the techniques disclosed here feature an output control circuit including: a first amplifier that amplifies a fundamental frequency signal that is inputted from an input terminal; an N-multiplier that N-multiplies the fundamental frequency signal thus amplified and generates an N-multiplied frequency signal; a second amplifier that amplifies the N-multiplied frequency signal; an output terminal via which the N-multiplied frequency signal thus amplified is outputted; a detector that detects the fundamental frequency signal thus amplified and the N-multiplied frequency signal thus amplified and outputs a first detection signal representing a signal level of the fundamental frequency signal thus amplified and a second detection signal representing a signal level of the N-multiplied frequency signal thus amplified; and a gain control circuit that controls a gain of the first amplifier on a basis of the first detection signal and controls a gain of the second amplifier on a basis of the second detection signal, wherein the gain control circuit includes a gain switching controller that changes the respective gains of the first and second amplifiers, and a comparator that determines, on a basis of the first and second detection signals, whether an operating state of the N-multiplier is a saturated operation or a linear operation, the comparator determines the operating state of the N-multiplier by comparing an amount of change in the first detection signal with respect to an amount of change in the gain of the first amplifier as changed by the gain switching controller with an amount of change in the second detection signal with respect to the amount of change in the gain of the first amplifier, and the gain switching controller adjusts the respective gains of the first and second amplifiers on a basis of the operating state thus determined.

The output control circuit of the present disclosure can determine the operating state (saturated operation/linear operation) of an N-multiplier in the case of a variation in the signal level of a high-frequency signal (radio frequency signal) due to external factors (e.g., temperature change and power supply variation) and optimally control the adjustment of the gain of a fundamental frequency amplifier and the gain of an N-multiplied frequency amplifier so that the operating state of the N-multiplier may be the saturated operation. As a result, the output control circuit of the present disclosure suppresses an expansion in the control range of amounts of gain adjustment and holds the signal level of a high-frequency signal constant, thus making it possible to suppress an increase in size of an amplifier circuit and an increase in consumption current.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

BRIEF DESCRIPTION OF THE DRAWINGS

FIG. 8A shows the input-output characteristic of the N-multiplied frequency amplifier 14 in the case of occurrence of temperature change and power supply variation;

FIG. 8B shows the input-output characteristic of the fundamental frequency amplifier 11 in the case of occurrence of temperature change and power supply variation;

FIG. 9 shows a circuit configuration of an output control circuit 4 according to a fourth embodiment of the present disclosure;

FIG. 11A shows a first example of a configuration of main components of a transmitting device 200 according to a fifth embodiment of the present disclosure;

FIG. 11B shows a second example of a configuration of main components of a transmitting device 300 according to the fifth embodiment of the present disclosure.

DETAILED DESCRIPTION

Embodiments of the present disclosure are described below with reference to the drawings. It should be noted that each of the embodiments that are described below is an example and the present disclosure is not limited by these embodiments.

First Embodiment

Figure 1:
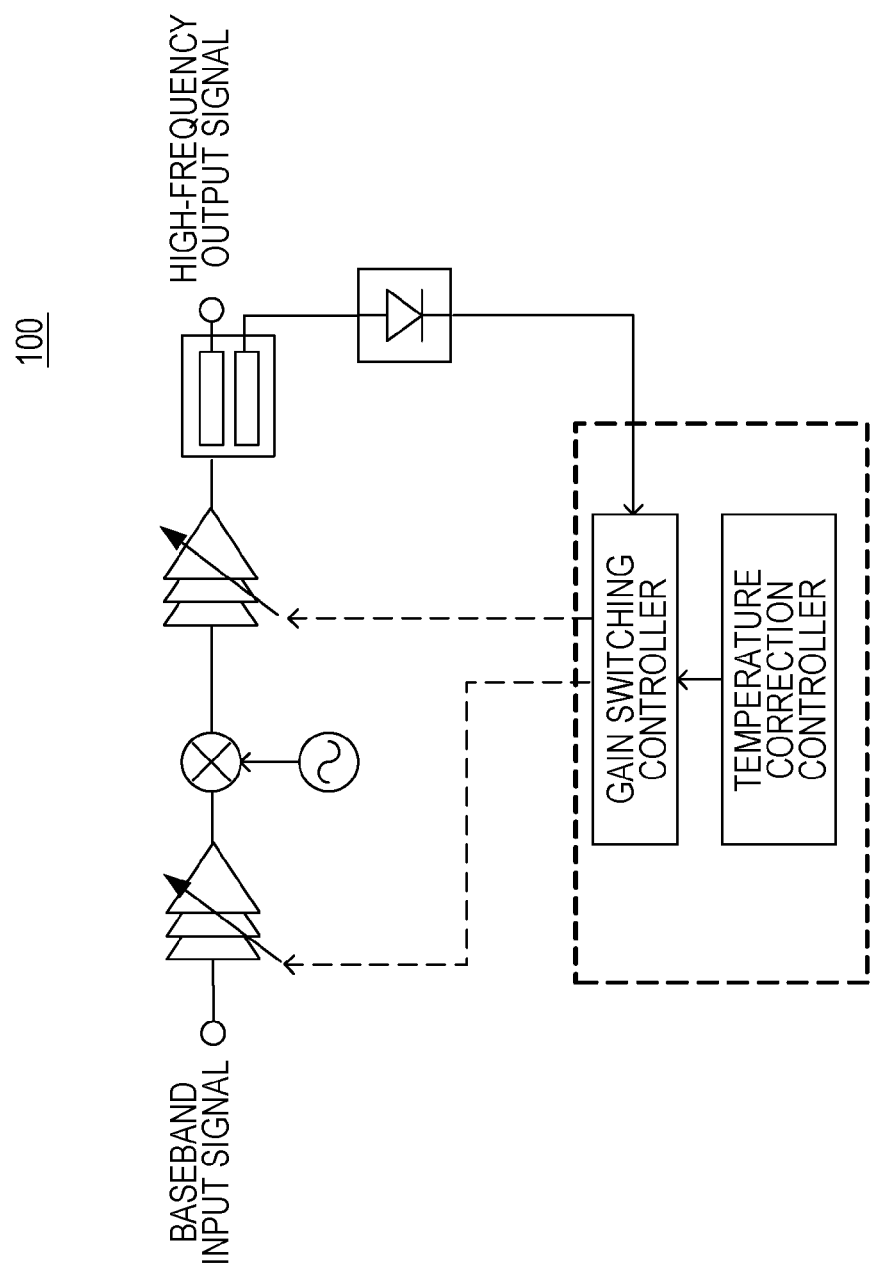
FIG. 1 schematically shows a configuration of a conventional control circuit 100 described in Japanese Patent No. 5206828.
Figure 2:
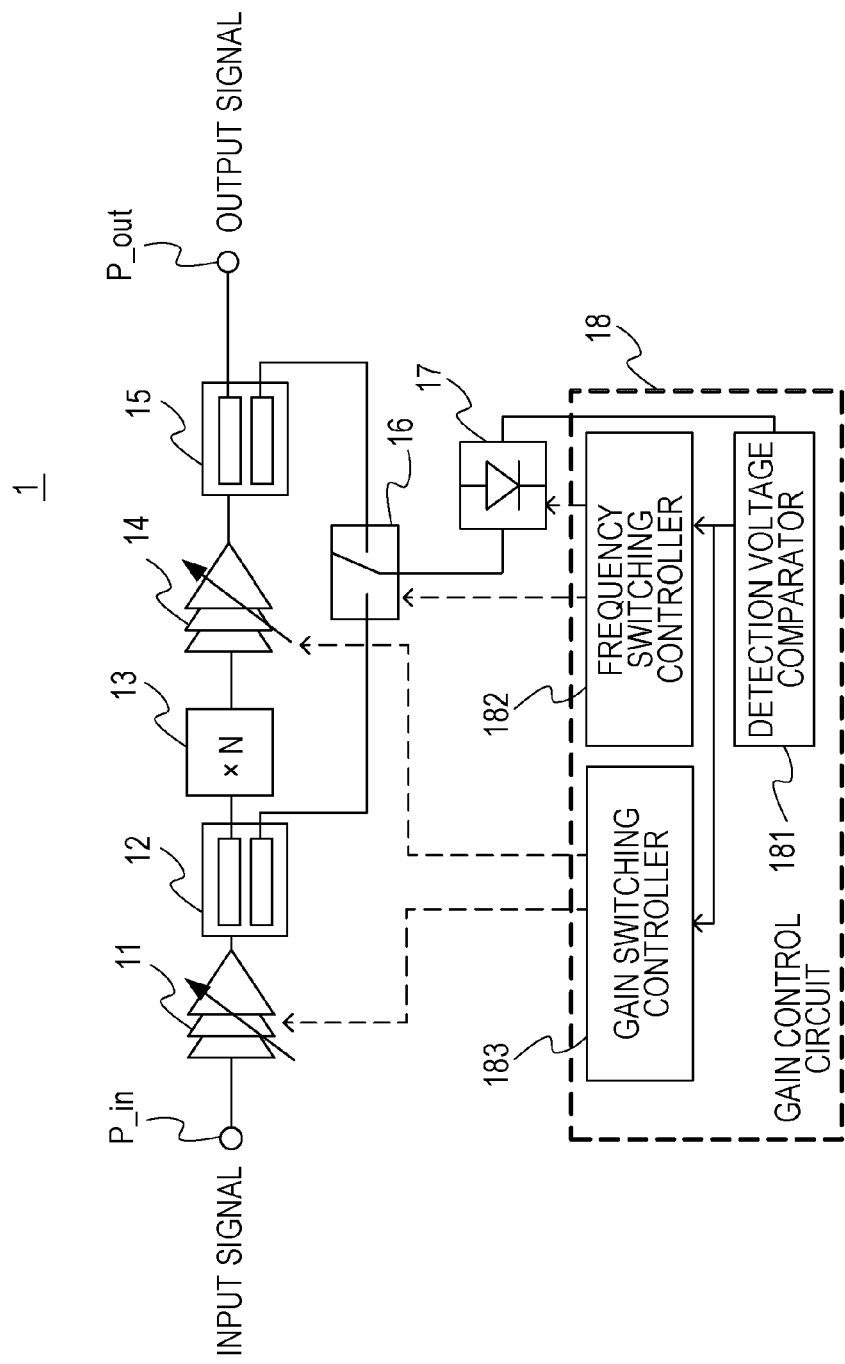
FIG. 2 shows a circuit configuration of an output control circuit 1 according to a first embodiment of the present disclosure.

FIG. 2 shows a circuit configuration of an output control circuit 1 according to a first embodiment of the present disclosure. The output control circuit 1 includes a fundamental frequency amplifier (first amplifier) 11, a first distributor 12, an N-multiplier 13, an N-multiplied frequency amplifier (second amplifier) 14, a second distributor 15, a switcher 16, a detector 17, and a gain control circuit 18. The gain control circuit 18 includes a detection voltage comparator (comparator) 181, a frequency switching controller 182, and a gain switching controller 183.

The fundamental frequency amplifier 11 is for example a variable amplifier whose gain can be variably adjusted. The fundamental frequency amplifier 11 amplifies a signal of a fundamental frequency (fc) that is generated by an oscillator circuit (not illustrated) and inputted from an input terminal P_in, and outputs the fundamental frequency signal thus amplified to the first distributor 12. The fundamental frequency amplifier 11 switches its gain with a preset gain width on the basis of a control signal that is outputted from the gain switching controller 183. The fundamental frequency amplifier 11 amplifies the fundamental frequency signal to cause a change in the signal level of the fundamental frequency signal.

The first distributor 12 is for example a coupler that outputs an input signal to a plurality of systems in a distributive manner. The first distributor 12 is connected to an output terminal of the fundamental frequency amplifier 11 and outputs, to the N-multiplier 13 and the switcher 16, the fundamental frequency signal that is outputted from the fundamental frequency amplifier 11.

The N-multiplier 13 converts the frequency band of the signal of the fundamental frequency fc into a frequency band N×fc. Specifically, the N-multiplier 13 adjusts output matching so that an N-multiplied harmonic frequency component may be outputted from the fundamental frequency signal that is outputted from the first distributor 12, and outputs a high-frequency signal (radio frequency signal) whose frequency is N×fc to the N-multiplied frequency amplifier 14.

The N-multiplied frequency amplifier 14 is for example a variable amplifier whose gain can be variably adjusted. The N-multiplied frequency amplifier 14 amplifies the high-frequency signal that is outputted from the N-multiplier 13, and outputs the high-frequency signal thus amplified to the second distributor 15. Further, the N-multiplied frequency amplifier 14 switches its gain on the basis of a control signal that is outputted from the gain switching controller 183.

The second distributor 15 is for example a coupler that outputs an input signal to a plurality of systems in a distributive manner. The second distributor 15 is connected to an output terminal P_out of the N-multiplied frequency amplifier 14 and outputs, to an output terminal P_out of the output control circuit 1 and to the switcher 16, the high-frequency signal that is outputted from the N-multiplied frequency amplifier 14.

The switcher 16 selects, in accordance with a switching instruction from the frequency switching controller 182, the fundamental frequency signal that is outputted from the first distributor 12 or the high-frequency signal that is outputted from the second distributor 15, and outputs the selected signal to the detector 17. The switching instruction is an instruction that indicates whether the signal to be detected by the detector 17 is the fundamental frequency signal or the high-frequency signal. The switcher 16 changes the setting of an operating frequency in accordance with the switching instruction.

The detector 17 detects, in accordance with the switching instruction from the frequency switching controller 182, the signal that is outputted from the switcher 16, and outputs, to the detection voltage comparator 181, a detection signal that indicates a result of the detection. The detector 17 receives the switching instruction from the frequency switching controller 182 and changes, in accordance with the frequency of the signal that is outputted from the switcher 16, the setting of an operating frequency for performing detection. Then, the detector 17 performs envelope detection of the signal and outputs, as a detection signal to the detection voltage comparator 181, a voltage (i.e., a signal level) that indicates the value of an envelope.

The gain control circuit 18 receives the signal level of the fundamental frequency signal and the signal level of the high-frequency signal, changes the proportion of gain adjustment of the fundamental frequency amplifier 11 and the proportion of gain adjustment of the N-multiplied frequency amplifier 14, and performs feedback control so that the signal level of the high-frequency signal that is outputted from the output terminal P_out may take on a constant value.

The detection voltage comparator 181 detects, at regular time intervals, the signal level of the high-frequency signal that is outputted from the detector 17. In a case where the detection voltage comparator 181 determines that the signal level of the high-frequency signal exceeds a preset acceptable range of control, the gain control circuit 18 starts feedback control that changes the proportions of gain adjustment. The detection voltage comparator 181 outputs, to the gain switching controller 183 and the frequency switching controller 182, a start instruction to start the feedback control.

Further, in the feedback control, the detection voltage comparator 181 compares an amount of change in the detection signal representing the fundamental frequency signal with respect to an amount of change in the gain of the fundamental frequency amplifier 11 with an amount of change in the detection signal representing the high-frequency signal (N-multiplied frequency signal) with respect to the amount of change in the gain of the fundamental frequency amplifier 11 and thereby determines whether the operating state of the N-multiplier 13 is a saturated operation or a linear operation. The detection voltage comparator 181 outputs, to the gain switching controller 183, a result of determination that indicates the operating state of the N-multiplier 13. It should be noted that a method of determination in which the detection voltage comparator 181 indicates the operating state of the N-multiplier 13 will be described below.

The frequency switching controller 182 performs, on the switcher 16 and the detector 17, switching control that switches operating frequencies.

In accordance with the start instruction that is outputted from the detection voltage comparator 181, the gain switching controller 183 outputs, to the fundamental frequency amplifier 11, a control signal that indicates that the fundamental frequency signal is amplified with the preset gain width.

Further, the gain switching controller 183 adjusts the gain of the fundamental frequency amplifier 11 and the gain of the N-multiplied frequency amplifier 14 on the basis of the result of determination that indicates the operating state of the N-multiplier 13. It should be noted that a method of gain adjustment by the gain switching controller 183 will be described below.

The following describes a method that the gain control circuit 18 employs to determine the operating state of the N-multiplier 13.

During normal operation, the gain control circuit 18 sets operating frequencies for the switcher 16 and the detector 17, respectively, so that the detector 17 may detect the signal level of the high-frequency signal.

Specifically, the frequency switching controller 182 of the gain control circuit 18 outputs, to the switcher 16 and the detector 17, a switching instruction that indicates that the signal to be detected by the detector 17 is the high-frequency signal. The switcher 16 and the detector 17 perform the settings of operating frequencies, respectively, in accordance with the switching instruction so that the detector 17 may detect the signal level of the high-frequency signal.

Then, the detection voltage comparator 181 of the gain control circuit 18 detects, at regular time intervals, the signal level of the high-frequency signal that is outputted from the detector 17. In a case where the detection voltage comparator 181 determines that the signal level of the high-frequency signal exceeds the preset acceptable range of control, the gain control circuit 18 starts feedback control that changes the proportions of gain adjustment.

First, the detection voltage comparator 181 outputs, to the gain switching controller 183 and the frequency switching controller 182, a start instruction to start the feedback control.

In accordance with the start instruction that is outputted from the detection voltage comparator 181, the gain switching controller 183 outputs, to the fundamental frequency amplifier 11, a control signal that indicates that the fundamental frequency signal is amplified with the preset gain width. The fundamental frequency amplifier 11 switches its gain with the preset gain width on the basis of a control signal that is outputted from the gain switching controller 183, and amplifies the fundamental frequency signal to cause a change in the signal level of the fundamental frequency signal.

An example describes a case where the gain switching controller 183 switches the gain of the fundamental frequency amplifier 11 to either a first gain or a second gain as the preset gain width. First, the gain switching controller 183 outputs, to the fundamental frequency amplifier 11, a control signal that switches the gain of the fundamental frequency amplifier 11 to the first gain.

In accordance with the start instruction that is outputted from the detection voltage comparator 181, the frequency switching controller 182 outputs, to the switcher 16 and the detector 17, a switching instruction that indicates that the signal to be detected by the detector 17 is the fundamental frequency signal.

The switcher 16 and the detector 17 perform the settings of operating frequencies, respectively, in accordance with the switching instruction so that the detector 17 may detect the signal level of the fundamental frequency signal. Then, the detector 17 detects the signal level of the fundamental frequency signal amplified by the fundamental frequency amplifier 11 with the preset first gain and outputs, to the detection voltage comparator 181, a detection signal that indicates a result of the detection (first detection signal of the first gain).

After having received the signal level of the fundamental frequency signal from the detector 17, the detection voltage comparator 181 outputs an instruction to the frequency switching controller 182 to detect the signal level of the high-frequency signal with respect to the signal level of the fundamental frequency signal thus received. The frequency switching controller 182 outputs, to the switcher 16 and the detector 17, a switching instruction that indicates that the signal to be detected by the detector 17 is the high-frequency signal. The switcher 16 and the detector 17 perform settings of operating frequencies, respectively, in accordance with the switching instruction so that the detector 17 may detect the signal level of the high-frequency signal. Then, the detector 17 detects the signal level of the high-frequency signal with respect to the fundamental frequency signal amplified with the first gain and outputs, to the detection voltage comparator 181, a detection signal that indicates a result of the detection (second detection signal of the first gain).

After having received the detection signal of the signal level of the fundamental frequency signal amplified with the first gain and the detection signal of the signal level of the high-frequency signal with respect to the fundamental frequency signal amplified with the first gain, the detection voltage comparator 181 outputs, to the gain switching controller 183 and the frequency switching controller 182, an instruction to perform detection with the next gain, i.e., the second gain. The gain switching controller 183 outputs, to the fundamental frequency amplifier 11, a control signal that switches the gain of the fundamental frequency amplifier 11 to the second gain.

Then, in accordance with the instruction to perform detection of the fundamental frequency signal amplified with the second gain that is outputted from the detection voltage comparator 181, the frequency switching controller 182 outputs, to the switcher 16 and the detector 17, a switching instruction that indicates that the signal to be detected by the detector 17 is the fundamental frequency signal amplified with the second gain. The switcher 16 and the detector 17 perform detection with the second gain that is similar to the aforementioned detection with the first gain. With this, the detection voltage comparator 181 receives a detection signal of the signal level of the fundamental frequency signal amplified with the second gain (first detection signal of the second gain) and a detection signal of the signal level of the high-frequency signal with respect to the fundamental frequency signal amplified with the second gain (second detection signal of the second gain).

As mentioned above, the detection voltage comparator 181 acquires the signal levels of the fundamental frequency signal and the high-frequency signal in a case where the gain of the fundamental frequency amplifier 11 has been switched to the first gain and the signal levels of the fundamental frequency signal and the high-frequency signal in a case where the gain of the fundamental frequency amplifier 11 has been switched to the second gain. On the basis of these signal levels, the detection voltage comparator 181 calculates the difference (range of changes) between the signal levels of the fundamental frequency signals (first detection signals) and the difference (range of changes) between the signal levels of the high-frequency signals (second detection signals) in a case where the fundamental frequency amplifier 11 has switched its gain with the preset gain width. The detection voltage comparator 181 compares these differences (amounts of change) between signal levels and thereby determines whether the operating state of the N-multiplier 13 is a linear operating state or a saturated operating state.

The following illustrates the principle of the method of determination of the operating state of the N-multiplier 13 by the detection voltage comparator 181.

Figure 3A:
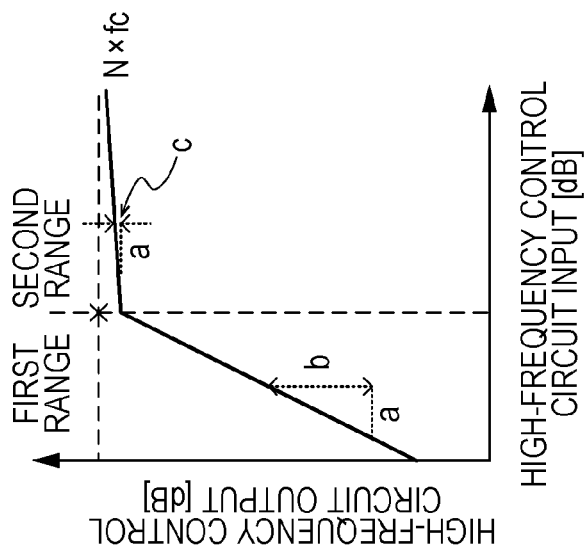
FIG. 3A shows the input-output characteristics of a fundamental frequency amplifier 11 and an N-multiplied frequency amplifier 14.

FIG. 3A shows the input-output characteristics of the fundamental frequency amplifier 11 and the N-multiplied frequency amplifier 14. In FIG. 3A, the horizontal axis represents the signal level [dB] of an input signal to each of the amplifiers, and the vertical axis represents the signal level [dB] of an output signal from each of the amplifiers. Further, in FIG. 3A, fc denotes the input-output characteristic of the fundamental frequency amplifier 11, and N×fc denotes the input-output characteristic of the N-multiplied frequency amplifier 14.

Figure 3B:
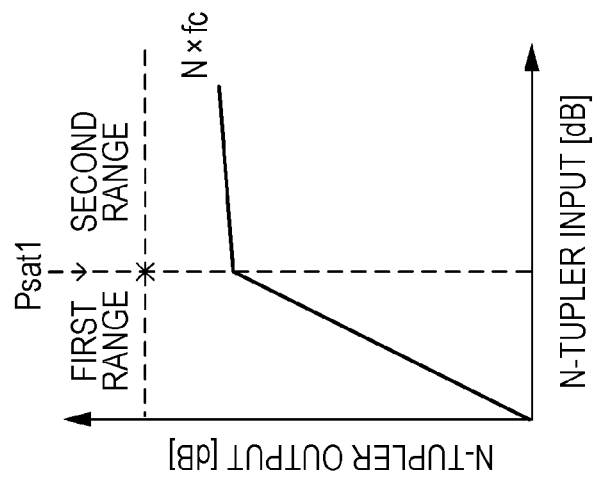
FIG. 3B shows the input-output characteristic of an N-multiplier 13.

FIG. 3B shows the input-output characteristic of the N-multiplier 13. In FIG. 3B, the horizontal axis represents the signal level [dB] of an input signal to the N-multiplier 13, and the vertical axis represents the signal level [dB] of an output signal from the N-multiplier 13. It should be noted that, in FIG. 3B, N×fc denotes the input-output characteristic of a high-frequency signal that is outputted from the N-multiplier 13 in response to a fundamental frequency signal that is inputted to the N-multiplier 13.

Figure 3C:
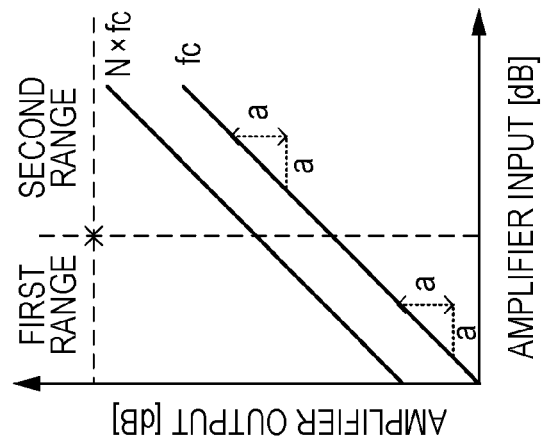
FIG. 3C shows the input-output characteristic of the output control circuit 1.

FIG. 3C shows the input-output characteristic of the output control circuit 1. In FIG. 3C, the horizontal axis represents the signal level [dB] of an input signal to the output control circuit 1, and the vertical axis represents the signal level [dB] of an output signal from the output control circuit 1. FIG. 3C shows the input-output characteristic of the whole output control circuit 1. In other words, FIG. 3C shows an input-output characteristic obtained by combining the input-output characteristic of each of the amplifiers (see FIG. 3A) and the input-output characteristic of the N-multiplier 13 (see FIG. 3B). That is, the signal level of the input signal to the output control circuit 1 as represented by the horizontal axis of FIG. 3C is the signal level of the fundamental signal to be amplified by the fundamental frequency amplifier 11, and the signal level of the output signal to the output control circuit 1 as represented by the vertical axis of FIG. 3C is the signal level of the high-frequency signal amplified by the N-multiplied frequency amplifier 14.

Further, in FIG. 3B, the input-output characteristic of the N-multiplier 13 is divided into a first range and a second range at an input level (Psat1) of a 1-dB gain suppression point. The first range is a linear operation region in which the signal level of the input signal is equal to or lower than Psat1. The second range is a saturated operation region in which the signal level of the input signal is higher than Psat1. Further, each of FIGS. 3A and 3C shows first and second ranges as ranges that correspond to the first and second ranges shown in FIG. 3B.

A case is described here where as shown in FIG. 3A, for example, the signal level of the fundamental frequency signal as input to the fundamental frequency amplifier 11 changes within a range of changes (range of changes in input) a [dB] in the first and second ranges. In this case, the fundamental frequency amplifier 11 has an input-output characteristic of linear amplification, the range of changes (range of changes in output) in the fundamental frequency signal that is outputted from the fundamental frequency amplifier 11 is a [dB] in the first and second ranges.

The high-frequency signal that is outputted from the N-multiplier 13 is an N-multiplied harmonic. Therefore, in a case where the range of changes in the signal that is inputted to the N-multiplier 13 (i.e., the fundamental frequency signal that is outputted from the fundamental frequency amplifier 11) in the first range is a [dB] and the range of changes in the high-frequency signal that is outputted from the N-multiplier 13 in the first range is b [dB], b [dB]=10 log N+a [dB] holds (that is, b [dB] is N times greater than a [dB] in antilogarithm).

Meanwhile, the input-output characteristic of the N-multiplier 13 is a saturated operating state in the second range. Therefore, in a case where the range of changes in the signal that is inputted to the N-multiplier 13 (i.e., the fundamental frequency signal that is outputted from the fundamental frequency amplifier 11) in the second range is a [dB] and the range of changes in the high-frequency signal that is outputted from the N-multiplier 13 in the second range is c [dB], c [dB]<a [dB] holds.

As shown in FIG. 3C, the range of changes in the signal level of the high-frequency signal depends on whether the operating state of the N-multiplier 13 is the linear operating state (first range) or the saturated operating state (second range). In the output control circuit 1 according to the first embodiment, the gain switching controller 183 generates a change in the signal level of the fundamental frequency signal by amplifying the fundamental frequency signal with the preset gain width. Then, the detection voltage comparator 181 compares the range of changes in the signal level of the fundamental frequency signal thus generated (amount of change in the first detection signal) with the range of changes in the signal level of the high-frequency signal with respect to the range of changes in the signal level of the fundamental frequency signal (amount of change in the second detection signal) and thereby determines whether the operating state of the N-multiplier 13 is the linear operating state (first range) or the saturated operating state (second range).

The detection voltage comparator 181 compares the range of changes in the signal level of the fundamental frequency signal thus generated with the range of changes in the signal level of the high-frequency signal with respect to the range of changes in the signal level of the fundamental frequency signal. In a case where the range of changes in the signal level of the fundamental frequency signal is smaller than the range of changes in the signal level of the high-frequency signal, the detection voltage comparator 181 determines that the operating state of the N-multiplier 13 is the linear operating state (first range). On the other hand, in a case where the range of changes in the signal level of the fundamental frequency signal is equal to or larger than the range of changes in the signal level of the high-frequency signal, the detection voltage comparator 181 determines that the operating state of the N-multiplier 13 is the saturated operating state (second range).

In this way, the detection voltage comparator 181 determines the operating state of the N-multiplier 13 by comparing the range of changes in the signal level of the fundamental frequency signal thus generated with the range of changes in the signal level of the high-frequency signal with respect to the range of changes in the signal level of the fundamental frequency signal.

In the output control circuit 1 according to the first embodiment, the gain switching controller 183 generates a change in the signal level of the fundamental frequency signal by amplifying the fundamental frequency signal with the preset gain width. However, the present disclosure is not limited to this. For example, the oscillator circuit that generates the fundamental frequency signal may generate a change in the signal level of the fundamental frequency signal.

The following describes the method of adjustment of the gains by the gain switching controller 183.

After having determined the operating state of the N-multiplier 13, the detection voltage comparator 181 outputs, to the gain switching controller 183, a signal that indicates a result of the determination. The gain switching controller 183 adjusts the respective gains of the fundamental frequency amplifier 11 and the N-multiplied frequency amplifier 14. Specifically, the gain switching controller 183 adjusts the gain of the fundamental frequency amplifier 11 in a case where the operating state of the N-multiplier 13 is the linear operating state. Alternatively, the gain switching controller 183 adjusts the gain of the N-multiplied frequency amplifier 14 in a case where the operating state of the N-multiplier 13 is the saturated operating state.

Figure 4A:
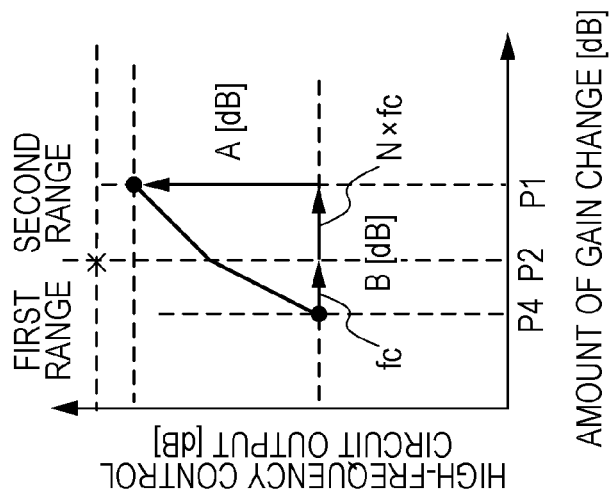
FIG. 4A shows a drop in the signal level of a high-frequency signal in the output control circuit 1.

FIG. 4A shows a drop in the signal level of the high-frequency signal in the output control circuit 1. In FIG. 4A, the horizontal and vertical axes are the same as the horizontal and vertical axes shown in FIG. 3C, respectively. A case is described where as shown in FIG. 4A, for example, the signal level of the high-frequency signal has dropped by A [dB] from the first range to the second range.

Figure 4B:
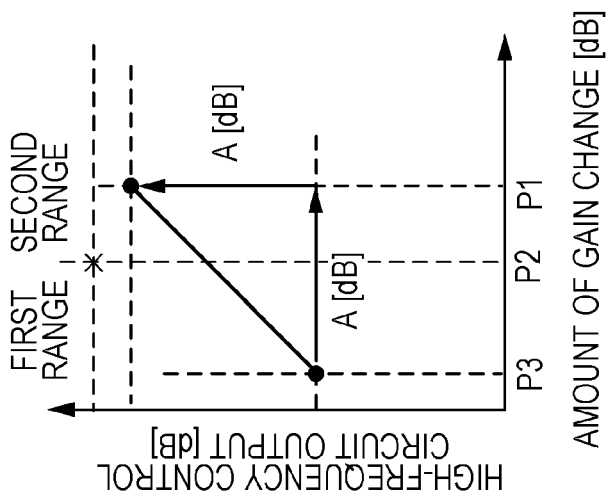
FIG. 4B shows a method for adjusting the gain of the N-multiplied frequency amplifier 14 with respect to the drop in signal level shown in FIG. 4A.

FIG. 4B shows a method for adjusting the gain of the N-multiplied frequency amplifier 14 with respect to the drop in signal level shown in FIG. 4A. In FIG. 4B, the horizontal axis represents the amount of change in the gain of N-multiplied frequency amplifier 14, and the vertical axis represents the output from the output control circuit 1. As shown in FIG. 4B, in a case where the gain of the N-multiplied frequency amplifier 14 is adjusted in response to the decrease in signal level of A [dB] shown in FIG. 4A, the gain of the N-multiplied frequency amplifier 14 needs to be adjusted from P3 to P1 shown in FIG. 4B. In this case, the N-multiplied frequency amplifier 14 requires an amount of gain correction of A [dB] (=$\Delta$(P1−P3)).

Figure 4C:
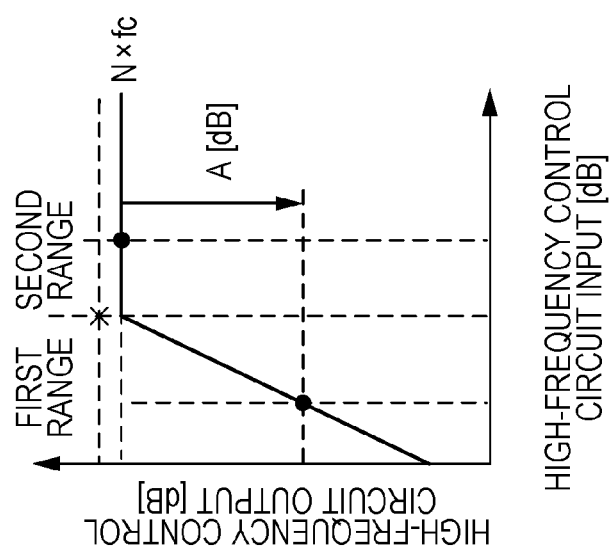
FIG. 4C shows a method for adjusting the gain of the fundamental frequency amplifier and the gain of the N-multiplied frequency amplifier with respect to the drop in signal level shown in FIG. 4A.

FIG. 4C shows a method for adjusting the gain of the fundamental frequency amplifier 11 and the gain of the N-multiplied frequency amplifier 14 with respect to the drop in signal level shown in FIG. 4A. In FIG. 4C, the horizontal axis represents the amount of change in the gain of the fundamental frequency amplifier 11 or the amount of change in the gain of the N-multiplied frequency amplifier 14, and the vertical axis represents the output from the output control circuit 1. The gain switching controller 183 adjusts the gains according to the operating state of the N-multiplier 13 in the following manner. That is, in the first range, as shown by fc in FIG. 4C, the gain switching controller 183 adjusts the gain of the fundamental frequency amplifier 11 provided at a stage preceding the N-multiplier 13. Moreover, in the second range, as shown by N×fc in FIG. 4C, the gain switching controller 183 adjusts the gain of the N-multiplied frequency amplifier 14 provided at a stage subsequent to the N-multiplier 13.

Specifically, the gain switching controller 183 increases the gain of the fundamental frequency amplifier 11 by an amount of gain change $\Delta$(P2−P4) and increases the gain of the N-multiplied frequency amplifier 14 by an amount of gain change $\Delta$(P1−P2). The gain switching controller 183 adjusts the gain of the fundamental frequency amplifier 11 in a case where the signal level falls within the first range, which is the linear operation region of the N-multiplier 13. This causes the amount of gain adjustment to decrease from A [dB] (=$\Delta$(P1−P3)) shown in FIG. 4B to B [dB] (=$\Delta$(P1−P4)) shown in FIG. 4C. In particular, since the signal level of a signal that is outputted from the N-multiplier 13 is N-multiplied in the linear operation region, the amount of gain adjustment in the first range can be multiplied by 1/N in antilogarithm by the gain switching controller 183 adjusting the gain of the fundamental frequency amplifier 11 in the first range.

The method of adjustment shown in FIG. 4C may be executed by repeating the process of determination of the signal level of the high-frequency signal, the process of determination of the operating state of the N-multiplier 13, and the process of adjustment of the gains.

For example, the detection voltage comparator 181 determines the operating state of the N-multiplier 13 in a case where the detection voltage comparator 181 determines that the signal level of the high-frequency signal exceeds the preset acceptable range of control. Then, in a case where it is determined that the N-multiplier 13 is in the linear operating state, the gain switching controller 183 increases the gain of the fundamental frequency amplifier 11 by a certain amount (a gain step (e.g., $\frac{1}{10} \times \Delta$(P1−P2)) that is smaller than $\Delta$(P2−P4) and $\Delta$(P1−P2)).

After that, the detection voltage comparator 181 determines the operating state of the N-multiplier 13 again in a case where the detection voltage comparator 181 determines again that the signal level of the high-frequency signal exceeds the preset acceptable range of control. Then, in a case where it is determined that the N-multiplier 13 is in the saturated operating state, the gain switching controller 183 increases the gain of the N-multiplied frequency amplifier 14 by a certain amount.

Meanwhile, in a case where it is determined again that the N-multiplier 13 is in the linear operating state, the gain switching controller 183 increases the gain of the fundamental frequency amplifier 11 again by a certain amount. By thus repeating the processes, the gain of the fundamental frequency amplifier 11 and the gain of the N-multiplied frequency amplifier 14 are adjusted so that the signal level of the high-frequency signal may fall within the preset acceptable range of control.

Alternatively, the method of adjustment shown in FIG. 4C may be executed by the gain switching controller 183 calculating the amounts of adjustment.

For example, in a case where the gains are antilogarithms, the equations $A=\Delta(P2-P4) \times N+\Delta(P1-P2)$ and $B=\Delta(P2-P4)+\Delta(P1-P2)$ hold. On the basis of these equations, the equation $\Delta(P2-P4)=(A-B)/(N-1)$ holds for the amount of adjustment $\Delta(P2-P4)$ of the gain of the fundamental frequency amplifier 11, and the equation $\Delta(P1-P2)=B-(A-B)/(N-1)$ holds for the amount of adjustment $\Delta(P1-P2)$ of the gain of the N-multiplied frequency amplifier 14. The gain switching controller 183 may calculate the amounts of adjustment on the basis of how much the gain are suppressed in response to linear gain changes.

The first embodiment thus described determines the operating state (saturated operation/linear operation) of the N-multiplier 13 by detecting the respective outputs from the fundamental frequency amplifier 11 and the N-multiplied frequency amplifier 14 even in the case of a change in the signal level of a high-frequency signal (radio frequency signal) and comparing the outputs thus detected. This makes it possible to determine the operating state of the N-multiplier 13 even in the case of occurrence of external factors (e.g., temperature change and power supply variation). This in turn makes it possible to optimally control the proportions of gain adjustment of the fundamental frequency amplifier 11 and the N-multiplied frequency amplifier 14 so that the operating state of the N-multiplier 13 may be the saturated operation.

Further, in the first embodiment, a result of detection by the common detector 17 is used in determining the operation region of the N-multiplier 13. This makes it possible to reduce the effects of variations in the results of outputs from the detector 17 due to the occurrence of external factors (e.g., temperature change and power supply variation).

Second Embodiment

An output control circuit 2 according to a second embodiment of the present disclosure includes a gain control circuit 19 including a temperature detector 184, thereby adjusting the gains of the fundamental frequency amplifier 11 and the N-multiplied frequency amplifier 14 according to an amount of temperature change.

Figure 5:
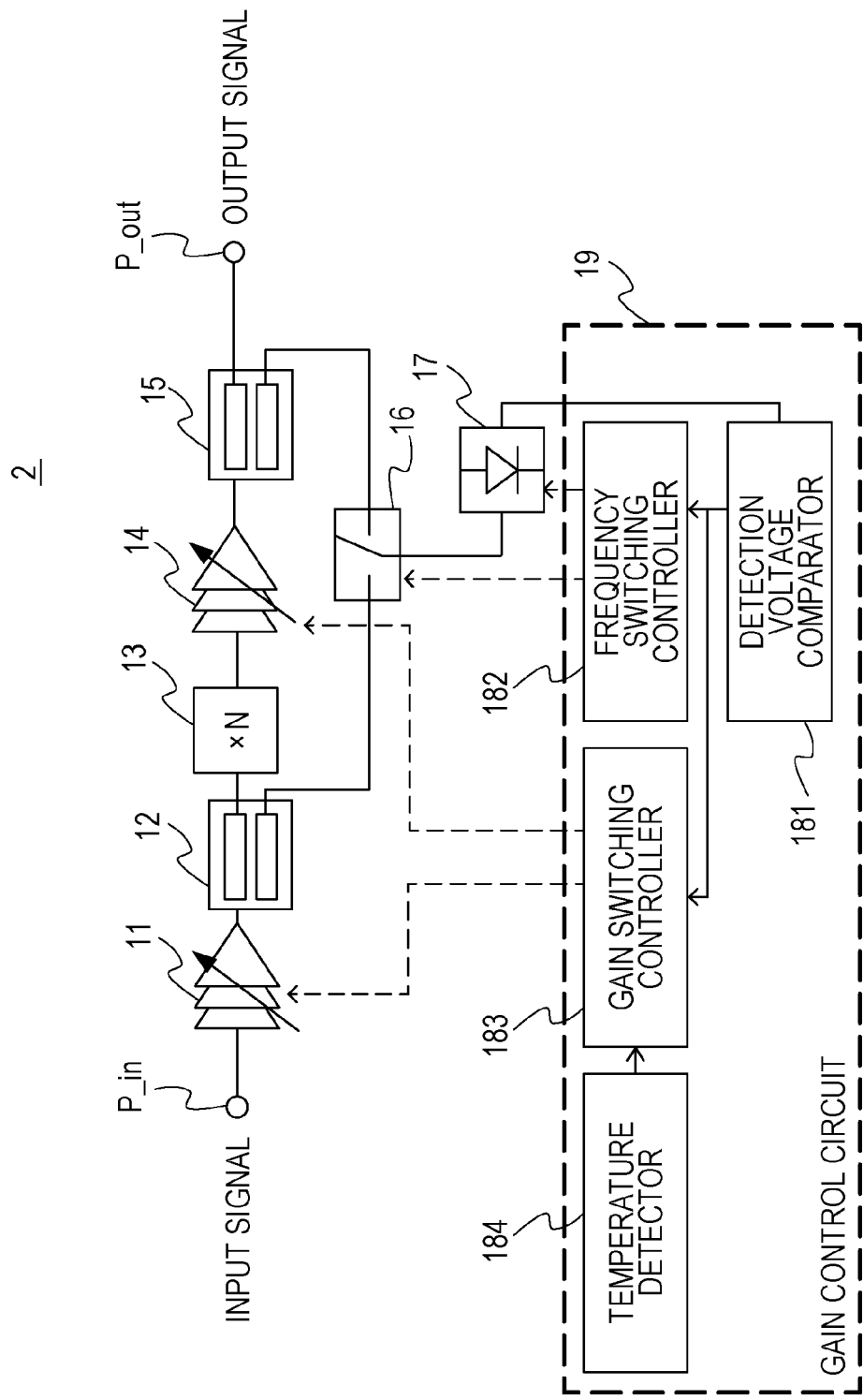
FIG. 5 shows a circuit configuration of an output control circuit 2 according to a second embodiment of the present disclosure.

FIG. 5 shows a circuit configuration of the output control circuit 2 according to the second embodiment. It should be noted that those components shown in FIG. 5 which are identical to those shown in FIG. 2 are given the same reference numerals as those shown in FIG. 2 and, as such, are not described in detail. The gain control circuit 19 shown in FIG. 5 further includes the temperature detector 184 in comparison with the gain control circuit 18 shown in FIG. 2.

The temperature detector 184 detects the ambient temperature of the output control circuit 2 and outputs information on the temperature thus detected to the gain switching controller 183.

The gain switching controller 183 adjusts the gains of the fundamental frequency amplifier 11 and the N-multiplied frequency amplifier 14 on the basis of the information on the temperature that is outputted from the temperature detector 184.

The following describes a method for adjusting the gains on the basis of the information on the temperature.

Figure 6A:
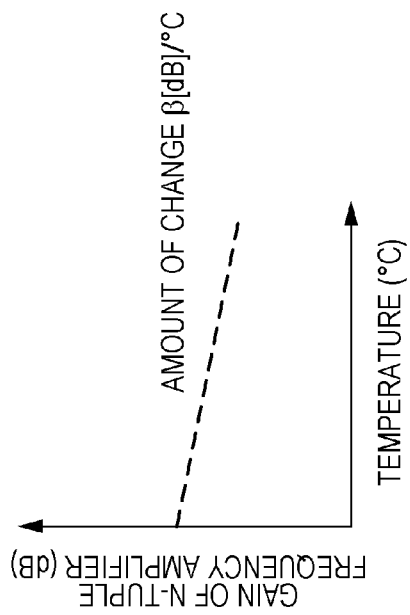
FIG. 6A shows the gain characteristic of the fundamental frequency amplifier 11 with respect to temperature change.
Figure 6B:
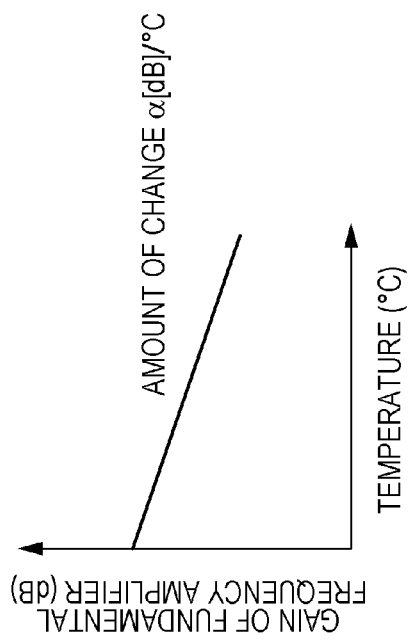
FIG. 6B shows the gain characteristic of the N-multiplied frequency amplifier 14 with respect to temperature change.
Figure 6C:
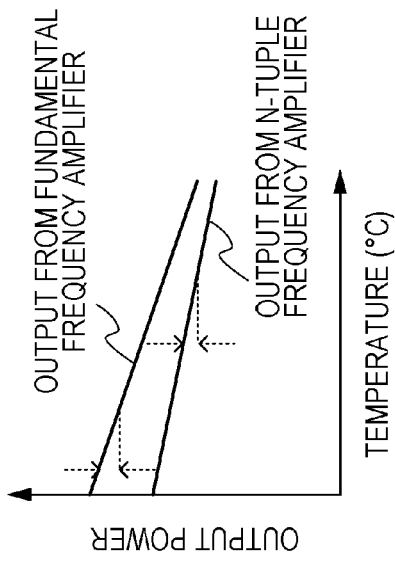
FIG. 6C shows the output characteristic of the output control circuit 2 with respect to temperature change in a case where the operating state of the N-multiplier 13 is a linear operation.
Figure 6D:
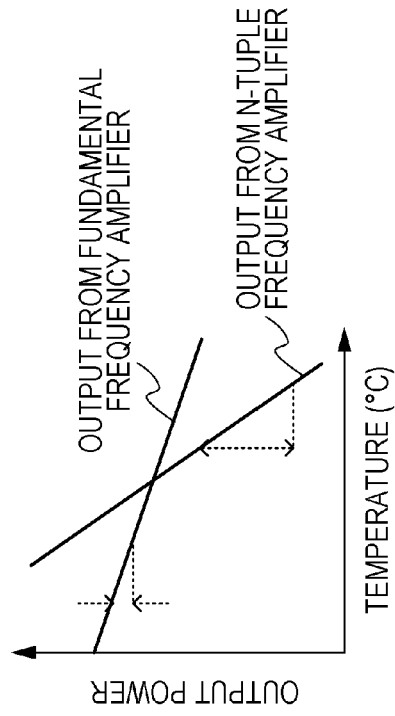
FIG. 6D shows the output characteristic of the output control circuit 2 with respect to temperature change in a case where the operating state of the N-multiplier 13 is a saturated operation.

FIG. 6A shows the gain characteristic of the fundamental frequency amplifier 11 with respect to temperature change. FIG. 6B shows the gain characteristic of the N-multiplied frequency amplifier 14 with respect to temperature change. FIG. 6C shows the output characteristic of the output control circuit 2 with respect to temperature change in a case where the operating state of the N-multiplier 13 is the linear operation. FIG. 6D shows the output characteristic of the output control circuit 2 with respect to temperature change in a case where the operating state of the N-multiplier 13 is the saturated operation.

As shown in FIG. 6A, the amount of change in the gain of the fundamental frequency amplifier 11 is $\alpha$ [dB]/° C. Meanwhile, as shown in FIG. 6B, the amount of change in the gain of the N-multiplied frequency amplifier 14 is the proportion of $\beta$ [dB]/° C.

The gain characteristic of the fundamental frequency amplifier 11 and the gain characteristic of the N-multiplied frequency amplifier 14 have the characteristics shown in FIGS. 6A and 6B, respectively, the output characteristic of the output control circuit 2 with respect to temperature change varies depending on the operating state of the N-multiplier 13.

As shown in FIG. 6C, in the output characteristic of the output control circuit 2 with respect to temperature change in a case where the operating state of the N-multiplier 13 is the linear operation, the change in output from the N-multiplied frequency amplifier 14 is greater than the change in output from the fundamental frequency amplifier 11. Specifically, the change in output from the N-multiplied frequency amplifier 14 is $10 \log N+\alpha+\beta$ [dB]/° C., whereas the change in output from the fundamental frequency amplifier 11 is $\alpha$ [dB]/° C. In this case, the difference between the change in output from the N-multiplied frequency amplifier 14 and the change in output from the fundamental frequency amplifier 11 is $10 \log N+\beta$ [dB]/° C.

Meanwhile, as shown in FIG. 6D, in the output characteristic of the output control circuit 2 with respect to temperature change in a case where the operating state of the N-multiplier 13 is the saturated operation, the change in output from the N-multiplied frequency amplifier 14 is smaller than the change in output from the fundamental frequency amplifier 11. Specifically, the change in output from the N-multiplied frequency amplifier 14 is $\beta$ [dB]/° C., whereas the change in output from the fundamental frequency amplifier 11 is $\alpha$ [dB]/° C. In this case, the difference between the change in output from the N-multiplied frequency amplifier 14 and the change in output from the fundamental frequency amplifier 11 is $\beta-\alpha$ [dB]/° C.

The gain control circuit 19 according to the second embodiment utilizes the differences in characteristic shown in FIGS. 6C and 6D to detect the changes in output with respect to temperature change and thereby determine the operating state of the N-multiplier 13.

Specifically, the temperature detector 184 detects the ambient temperature of the output control circuit 2 at predetermined intervals. Then, the temperature detector 184 outputs information on the temperature thus detected to the detection voltage comparator 181.

The detection voltage comparator 181 outputs a detection start instruction to the frequency switching controller 182 at each predetermined temperature on the basis of the temperature thus detected. Upon receiving the detection start instruction from the detection voltage comparator 181, the frequency switching controller 182 outputs an instruction to the switcher 16 and the detector 17 so that the signal level of the fundamental frequency signal and the signal level of the high-frequency signal may be detected at each predetermined temperature. The detector 17 detects the signal level of the fundamental frequency signal and the signal level of the high-frequency signal every time the ambient temperature changes by a predetermined temperature (at each predetermined temperature). The detector 17 outputs, to the detection voltage comparator 181, a detection signal that indicates a result of the detection.

The detection voltage comparator 181 acquires the signal level of the fundamental frequency signal and the signal level of the high-frequency signal from the detector 17 at each predetermined temperature. The detection voltage comparator 181 calculates the difference between the signal level of the high-frequency signal and the signal level of the fundamental frequency signal at each predetermined temperature.

The detection voltage comparator 181 stores the difference between the signal level of the high-frequency signal and the signal level of the fundamental frequency signal calculated at each predetermined temperature. In the case of occurrence of a preset temperature change (e.g., 1° C.), the detection voltage comparator 181 calculates a change in the difference between the signal level of the high-frequency signal and the signal level of the fundamental frequency signal with respect to the temperature change. Then, on the basis of the change in the difference between the signal level of the high-frequency signal and the signal level of the fundamental frequency signal with respect to the temperature change, the detection voltage comparator 181 determines whether the operating state of the N-multiplier 13 is the linear operation or the saturated operation.

As mentioned above, the output control circuit 2 includes the temperature detector 184 and can determine the operating state of the N-multiplier 13 by calculating a change in the difference between the signal level of the high-frequency signal and the signal level of the fundamental frequency signal with respect to temperature change. The adjustment of the gains after the determination of the operating state is identical to that performed by the output control circuit 1 shown in FIG. 2 and, as such, is not described here.

The second embodiment thus described can determine the operating state (saturated operation/linear operation) of the N-multiplier 13 by detecting a temperature change and a change in the signal level of a high-frequency signal with respect to the temperature change even in the case of the change in the signal level due to the temperature change. As a result, the second embodiment makes it possible to optimally control the proportions of gain adjustment of the fundamental frequency amplifier 11 and the N-multiplied frequency amplifier 14 so that the operating state of the N-multiplier 13 may be the saturated operation.

Further, the second embodiment can determine the operating state (saturated operation/linear operation) of the N-multiplier 13 by detecting a temperature change and a change in signal level with respect to the temperature change without causing a change in the gain of the fundamental frequency amplifier 11.

Third Embodiment

A common detector that operates in a high-frequency band such as a millimeter-wave band has a narrow detectable range of signals. Further, the characteristic of the common detector varies due to external factors (e.g., temperature change and power supply variation). For this reason, a common output control circuit requires calibration of the common detector so that signals that the common detector detects fall within the detectable range of signals.

Specifically, in staring operation, the common output control circuit causes the common detector to output a reference signal that serves as a reference and causes the common detector to detect the reference signal. Moreover, in the common output control circuit, the common detector is calibrated in advance so that a detection voltage that indicates a result of detection of the reference signal by the common detector falls within a predetermined setting range.

However, in a case where the common output control circuit includes a common signal generator (e.g., a common oscillator circuit that generates a fundamental frequency signal) that generates a reference signal in a high-frequency band such as a millimeter-wave band, it is difficult to perform accurate calibration, as a variation occurs in the characteristic of the common signal generator due to external factors (e.g., temperature change and power supply variation) and a variation accordingly occurs in the reference signal that is generated.

Therefore, in the third embodiment, an output control circuit than can improve the variation in the reference signal.

Figure 7:
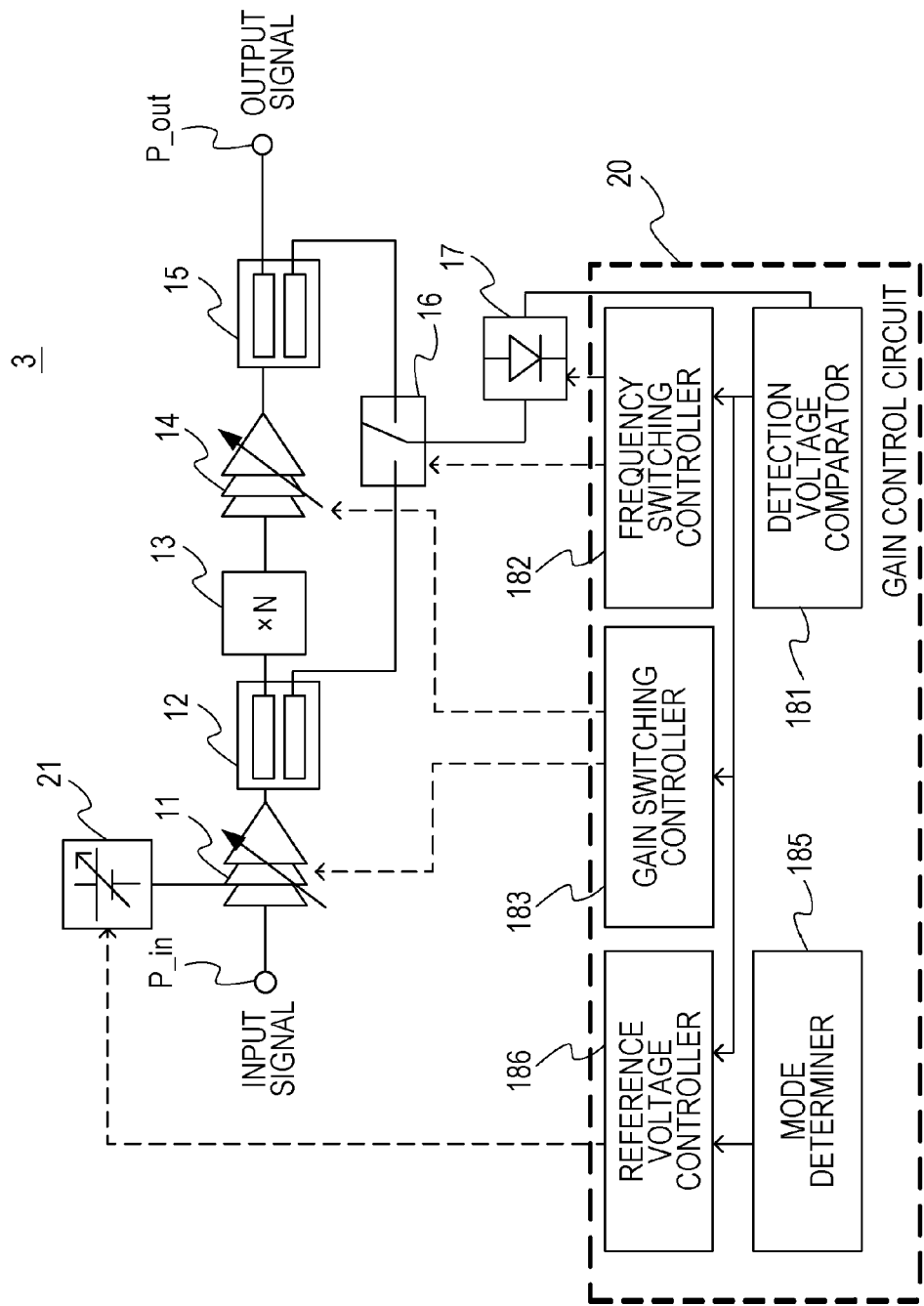
FIG. 7 shows a circuit configuration of an output control circuit 3 according to a third embodiment of the present disclosure.

FIG. 7 shows a circuit configuration of an output control circuit 3 according to a third embodiment of the present disclosure. It should be noted that those components shown in FIG. 7 which are identical to those shown in FIG. 2 are given the same reference numerals as those shown in FIG. 2 and, as such, are not described in detail. The output control circuit 3 shown in FIG. 7 further includes a reference voltage switcher 21, a mode determiner 185, a reference voltage controller 186 in comparison with the output control circuit 1 shown in FIG. 2.

The output control circuit 3 according to the third embodiment has two modes. One of the two modes is a calibration mode of calibrating the detector 17, and the other mode is a normal mode of outputting a high-frequency signal. It should be noted that the normal mode is not described here, as it is the mode described in the first embodiment in which a high-frequency signal is outputted.

The mode determiner 185 determines whether to select the calibration mode or the normal mode. The mode determiner 185 outputs a result of the determination to the reference voltage controller 186. The mode determiner 185 may determine to switch between the normal mode and the calibration mode at regular time intervals. Alternatively, in a case where no fundamental frequency signal is inputted to the output control circuit 3, the mode determiner 185 may determine to perform the calibration mode. Alternatively, at the time of startup, the output control circuit 3 may be initially adjusted by getting started first in the calibration mode and then in the normal mode. The initial adjustment at the time of startup makes it possible to reduce the variation in the characteristic of the detector with respect to an age deterioration of the circuit.

The reference voltage controller 186 outputs a control signal to the reference voltage switcher 21 in a case where the result of the determination that is outputted from the mode determiner 185 indicates the calibration mode. In a case where the result of the determination indicates the calibration mode, the reference voltage controller 186 sets a power supply voltage of the fundamental frequency amplifier 11 (power supply voltage of the calibration mode) lower than a power supply voltage of the normal mode.

FIG. 8A shows the input-output characteristic of the N-multiplied frequency amplifier 14 in the case of occurrence of temperature change and power supply variation. FIG. 8B shows the input-output characteristic of the fundamental frequency amplifier 11 in the case of occurrence of temperature change and power supply variation. In FIGS. 8A and 8B, the horizontal axes represent the signal levels [dB] of input signals to the respective amplifiers, and the vertical axes represent the signal levels [dB] of output signals from the respective amplifiers.

It should be noted that FIGS. 8A and 8B are the input-output characteristics of the respective amplifiers in the settings where the frequency (i.e., fundamental frequency) of a signal that the fundamental frequency amplifier 11 amplifies is fc=40 GHz, the frequency of a signal that the N-multiplied frequency amplifier 14 amplifies is N×fc=80 GHz, the temperature change ranges from −40° C. to 125° C., and the power supply voltage is V_Hi=0.95 V or V_Low=0.7 V. FIGS. 8A and 8B show the respective input-output characteristics in a total of six variation patterns in which there are two variations of power supply voltage V_Hi and V_Low and three variations of temperature T_min, T_typ, and T_max (T_min<T_typ<T_max).

In the input-output characteristic of the N-multiplied frequency amplifier 14 shown in FIG. 8A, the range of changes with respect to temperature change (i.e., the width between T_min and T_max) changes from 3 [dB] to 2.5 [dB] in a case where the power supply voltage changes from V_Hi to V_Low. That is, the range of changes with respect to temperature change does not change very much even when the power supply voltage changes from V_Hi to V_Low.

On the other hand, in the input-output characteristic of the fundamental frequency amplifier 11 shown in FIG. 8B, the range of changes with respect to temperature change (i.e., the width between T_min and T_max) changes from 0.9 [dB] to 0.3 [dB] in a case where the power supply voltage changes from V_Hi to V_Low.

That is, the range of changes with respect to temperature change can be restrained by setting the power supply voltage of the fundamental frequency amplifier 11 low. This in turn makes it possible to suppress the effect of temperature change on the fundamental frequency signal as the reference signal that is outputted to the detector 17.

In a common high-frequency amplifier including a FET (field-effect transistor), a higher band of operating frequencies leads to an uniform deterioration in the gain of the single FET and, by extension, to a greater range of changes in the gain with respect to variations such as power supply variations and temperature change. Further, the gain of a single FET depends on the magnitude of a power supply voltage. Therefore, in a case where the power supply voltage of a common high-frequency amplifier is lowered, the gain per se becomes lower. That is, as described with reference to FIG. 8A, in a common high-frequency amplifier whose band of operating frequencies is comparatively high and whose power supply voltage is high, the range of changes in the gain with respect to a variation in temperature change is large. On the other hand, as described with reference to FIG. 8B, in a common high-frequency amplifier whose band of operating frequencies is comparatively low and whose power supply voltage is low, the range of changes in the gain with respect to a variation in temperature change is small.

The output control circuit 3 according to the third embodiment thus described performs the control of lowering the power supply voltage of the fundamental frequency amplifier 11 in a case where calibration of the detector 17 is performed on the basis of the characteristic of the fundamental frequency amplifier 11 shown in FIG. 8B. This control causes the range of changes with respect to temperature change to be small in the input-output characteristic of the fundamental frequency amplifier 11. This suppresses the effect of temperature change on the fundamental frequency signal for calibrating the detector.

For example, in a case where the resolution with which the high-frequency signal is controlled is set to 1 [dB], the detector 17 can be calibrated regardless of temperature change by changing the power supply voltage shown in FIG. 8B from V_Hi to V_Low.

Fourth Embodiment

The output control circuit 2 shown in FIG. 2 has provided a description of a configuration in which the first distributor 12 distributes, to the N-multiplier 13 and the switcher 16, a fundamental frequency signal that is outputted from the fundamental frequency amplifier 11. In the case of this configuration, a fundamental frequency signal that is distributed from the first distributor 12 to the switcher 16 is more attenuated than the fundamental frequency signal that is outputted from the fundamental frequency amplifier 11. A fourth embodiment of the present disclosure provides a description of a configuration in which the attenuation of the fundamental frequency signal that is outputted to the switcher 16 is suppressed.

FIG. 9 shows a circuit configuration of an output control circuit 4 according to the fourth embodiment. It should be noted that those components shown in FIG. 9 which are identical to those shown in FIG. 2 are given the same reference numerals as those shown in FIG. 2 and, as such, are not described in detail. In comparison with the output control circuit 1 shown in FIG. 2, the output control circuit 4 shown in FIG. 9 replaces the N-multiplier 13 with an N-multiplier 23 and replaces the first distributor 12, which is connected to the output side of the fundamental frequency amplifier 11, with a distributor circuit 22 that is connected to the output side of the N-multiplier 23.

In the first embodiment, the N-multiplier 13 adjusts output matching so that an N-multiplied harmonic frequency component may be outputted from the fundamental frequency signal, and generates a high-frequency signal whose frequency is N×fc. The output control circuit 4 according to the fourth embodiment includes the distributor circuit 22, which is connected to the N-multiplier 23, and the distributor circuit 22 performs output matching.

The N-multiplier 23 generates, from the fundamental frequency signal that is outputted from the fundamental frequency amplifier 11, a signal having a plurality of harmonic frequency components including a fundamental frequency and N-multiplied harmonics, and outputs the signal to the distributor circuit 22.

The distributor circuit 22 generates a high-frequency signal whose frequency is N×fc from the signal that is outputted from the N-multiplier 23, and outputs the high-frequency signal to the N-multiplied frequency amplifier 14. Further, the distributor circuit 22 generates a fundamental frequency signal whose frequency is fc from the signal that is outputted from the N-multiplier 23, and outputs the fundamental frequency signal to the switcher 16.

Figure 10B:
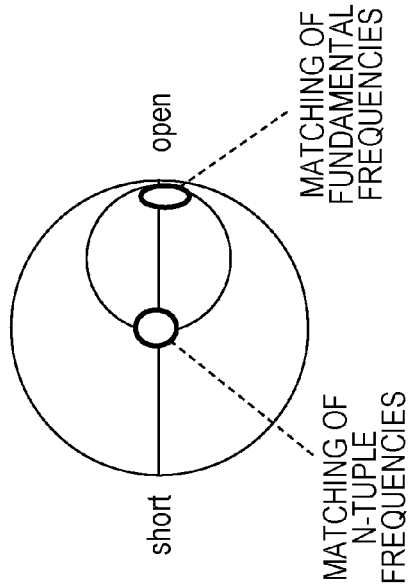
FIG. 10B is a Smith chart showing a matching condition for an N-multiplied frequency matching circuit 221.
Figure 10C:
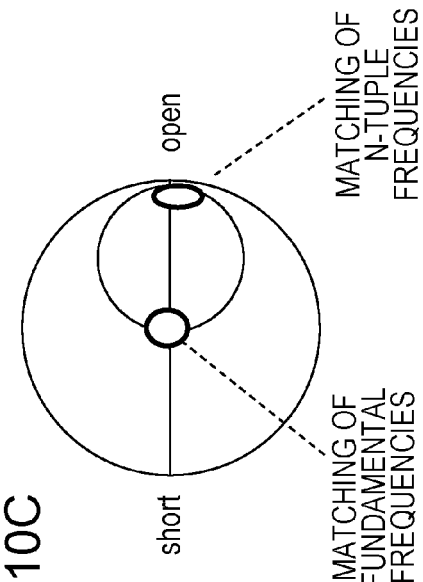
FIG. 10C is a Smith chart showing a matching condition for a fundamental frequency matching circuit 222.
Figure 10A:
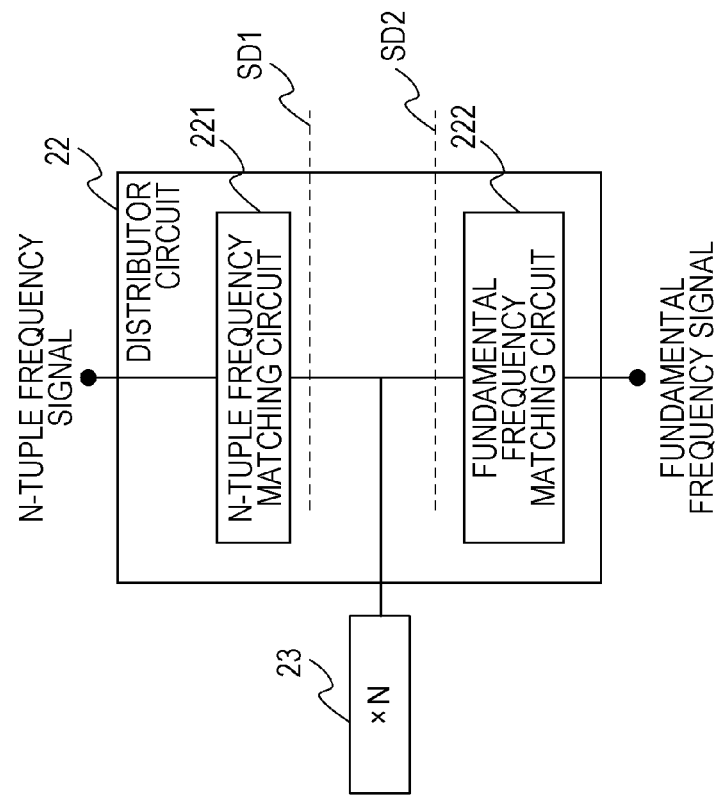
FIG. 10A shows an example of a configuration of a distributor circuit 22 according to the fourth embodiment of the present disclosure.

The following describes a specific example of a configuration of the distributor circuit 22 and matching conditions therefor. FIG. 10A shows an example of a configuration of the distributor circuit 22 according to the fourth embodiment. FIG. 10B is a Smith chart showing a matching condition for an N-multiplied frequency matching circuit 221. FIG. 10C is a Smith chart showing a matching condition for a fundamental frequency matching circuit 222.

As shown in FIG. 10A, the distributor circuit 22 includes the N-multiplied frequency matching circuit 221 and the fundamental frequency matching circuit 222, which are connected to the output terminal of the N-multiplier 23 in parallel with each other. The N-multiplied frequency matching circuit 221 adjusts output matching so that an N-multiplied harmonic frequency component may be outputted from the fundamental frequency signal that is outputted from the N-multiplier 23, and generates a high-frequency signal whose frequency is N×fc (N×fc shown in FIG. 9). The N-multiplied frequency matching circuit 221 outputs the high-frequency signal thus generated to the N-multiplied frequency amplifier 14. The fundamental frequency matching circuit 222 adjusts output matching so that a frequency component of a fundamental frequency may be outputted from the signal that is outputted from the N-multiplier 23, and generates a fundamental frequency signal whose frequency is fc (fc shown in FIG. 9). The fundamental frequency matching circuit 222 outputs the fundamental frequency signal thus generated to the switcher 16.

FIG. 10B shows an impedance (first impedance) of the N-multiplied frequency matching circuit 221 based on an end face SD1 of the distributor circuit 22 shown in FIG. 10A. As shown in FIG. 10B, the impedance of the N-multiplied frequency matching circuit 221 based on the end face SD1 is matched with an input impedance in a band of N-multiplied frequencies. The impedance of the N-multiplied frequency matching circuit 221 based on the end face SD1 is a high impedance that is close to OPEN in a band of fundamental frequencies.

FIG. 10C shows an impedance (second impedance) of the fundamental frequency matching circuit 222 based on an end face SD2 of the distributor circuit 22 shown in FIG. 10A. As shown in FIG. 10C, the impedance of the fundamental frequency matching circuit 222 based on the end face SD2 is matched with an input impedance in a band of fundamental frequencies. The impedance of the fundamental frequency matching circuit 222 based on the end face SD2 is a high impedance that is close to OPEN in a band of N-multiplied frequencies.

Since the distributor circuit 22 provided has the impedances shown in FIGS. 10B and 10C, there are no variations in output matching in the N-multiplied frequency matching circuit 221 and the fundamental frequency matching circuit 222 even when the matching circuits are connected to each other and the same signal is inputted to them. This allows each of the matching circuits to achieve matching in the required frequency band and distribute the output.

In the fourth embodiment thus described, the fundamental frequency signal that is outputted from the fundamental frequency amplifier 11 is further amplified by the N-multiplier 23. The distributor circuit 22 can adjust output matching of the fundamental frequency signal amplified by the N-multiplier 23 and output the fundamental frequency signal amplified by the N-multiplier 23 to the switcher 16. This configuration allows the detector 17 to detect a higher signal level from the fundamental frequency signal thus amplified.

Fifth Embodiment

The following describes a wireless communication device including the output control circuit 1 described in the first embodiment. FIG. 11A shows a first example of a configuration of main components of a transmitting device 200 according to a fifth embodiment of the present disclosure. The transmitting device 200 includes the output control circuit 1, a baseband amplifier (fourth amplifier) 201, a local signal output circuit 202, a mixer 203, and a high-frequency amplifier (third amplifier) 204.

The baseband amplifier 201 amplifies a baseband input signal obtained by subjecting data to be transmitted to encoding, modulation, and the like with a baseband signal processor (not illustrated), and outputs the baseband signal thus amplified to the mixer 203.

The local signal output circuit 202 generates a fundamental-frequency local signal and outputs the fundamental-frequency local signal to the output control circuit 1. The output control circuit 1 N-multiplies the fundamental-frequency local signal that is outputted from the local signal output circuit 202 and outputs an N-multiplied-frequency local signal to the mixer 203.

The mixer 203 mixes the baseband signal that is outputted from the baseband amplifier 201 and the N-multiplied-frequency local signal that is outputted from the output control circuit 1, and thereby converts the baseband signal into a high-frequency band of N-multiplied frequencies. The mixer 203 outputs the signal converted into the high-frequency band to the high-frequency amplifier 204.

The high-frequency amplifier 204 amplifies the high-frequency signal that is outputted from the mixer 203, and outputs the high-frequency signal thus amplified. The high-frequency signal outputted from the high-frequency amplifier 204 is subjected to predetermined transmission processing and then outputted from an antenna (not illustrated) or the like.

The following describes a configuration of another transmitting device according to the fifth embodiment. FIG. 11B shows a second example of a configuration of main components of a transmitting device 300 according to the fifth embodiment. The transmitting device 300 includes the output control circuit 1, a baseband amplifier (third amplifier) 301, a local signal output circuit 302, a mixer 303, and a high-frequency amplifier (fourth amplifier) 304. FIGS. 11A and 11B differ in position of the output control circuit 1 from each other.

The baseband amplifier 301 amplifies a baseband input signal obtained by subjecting data to be transmitted to encoding, modulation, and the like, and outputs the baseband signal thus amplified to the mixer 303.

The local signal output circuit 302 generates a fundamental-frequency local signal and outputs the fundamental-frequency local signal to the mixer 303.

The mixer 303 mixes the baseband signal that is outputted from the baseband amplifier 301 and the fundamental-frequency local signal that is outputted from the local signal output circuit 302, and thereby converts the baseband signal into a fundamental frequency band. The mixer 303 outputs the signal converted into the fundamental frequency band to the output control circuit 1.

The output control circuit 1 N-multiplies the signal converted into the fundamental frequency band that is outputted from the mixer 303, and outputs the high-frequency signal thus N-multiplied to the high-frequency amplifier 304.

The high-frequency amplifier 304 amplifies the high-frequency signal that is outputted from the output control circuit 1, and outputs the high-frequency signal thus amplified. The high-frequency signal that is outputted from the amplifier 304 is subjected to predetermined transmission processing and then outputted from an antenna (not illustrated) or the like.

Figure 12:
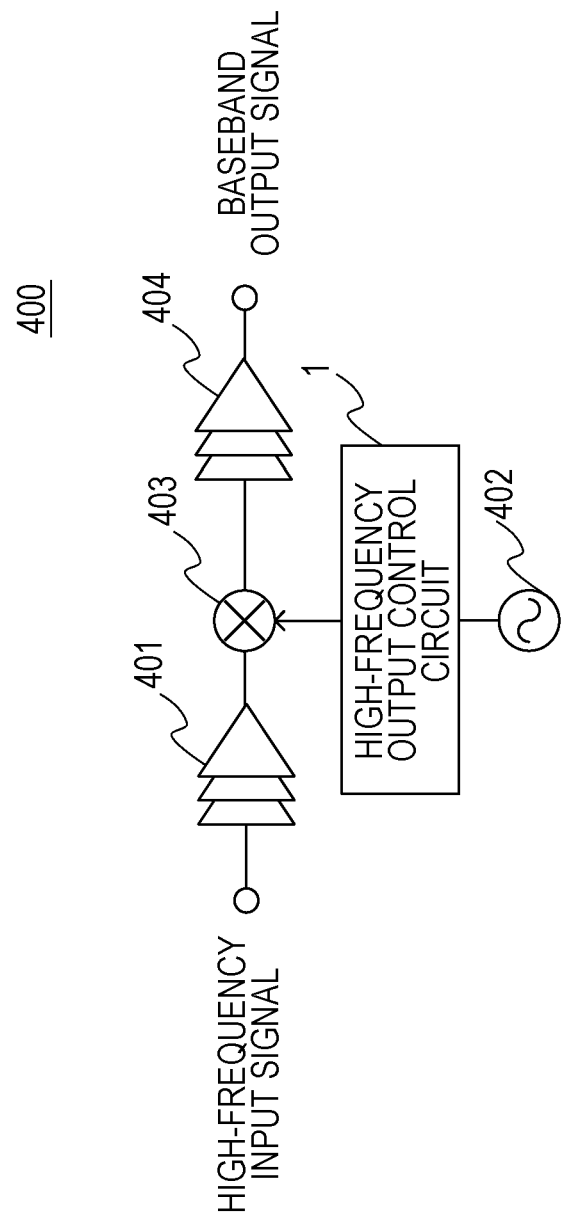
FIG. 12 shows an example of a configuration of main components of a receiving device 400 according to the fifth embodiment of the present disclosure.

The following describes a wireless communication receiving device including the output control circuit 1 described in the first embodiment. FIG. 12 shows an example of a configuration of main components of a receiving device 400 according to the fifth embodiment. The receiving device 400 includes the output control circuit 1, a high-frequency amplifier (third amplifier) 401, a local signal output circuit 402, a mixer 403, and a baseband amplifier (fourth amplifier) 404.

The high-frequency amplifier 401 amplifies a high-frequency input signal received by an antenna (not illustrated) or the like and subjected to predetermined reception processing and outputs the high-frequency signal thus amplified to the mixer 403.

The local signal output circuit 402 generates a fundamental-frequency local signal and outputs the fundamental-frequency local signal to the output control circuit 1. The output control circuit 1 N-multiplies the fundamental-frequency local signal that is outputted from the local signal output circuit 402, and outputs an N-multiplied-frequency local signal to the mixer 403.

The mixer 403 mixes the high-frequency signal that is outputted from the high-frequency amplifier 401 and the N-multiplied-frequency local signal that is outputted from the output control circuit 1, and thereby converts the high-frequency signal into a baseband signal. The mixer 403 outputs the baseband signal thus converted to the baseband amplifier 404.

The baseband amplifier 404 amplifies the baseband signal that is outputted from the mixer 403, and outputs the baseband signal thus amplified. The baseband output signal is subjected to processing such as demodulation and decoding by a baseband signal processor (not illustrated).

The fifth embodiment thus described uses the output control circuit 1 in the transmitting devices 200 and 300 and the receiving device 400 to hold the levels of output signals constant in transmission and reception in a high-frequency band to enable stable transmission and reception.

The fifth embodiment has described configurations in which the output control circuit 1 shown in FIG. 2 is used in the transmitting devices 200 and 300 and the receiving device 400. Alternatively, the output control circuits 2, 3, and 4 shown in FIGS. 5, 7, and 9 may be similarly used in the transmitting devices 200 and 300 and the receiving device 400.

It should be noted that the gain control circuits 18, 19, and 20 in the respective embodiments may be mounted on semiconductor integrated circuits such as LSIs. Further, the output control circuits 1, 2, 3, and 4 in the respective embodiments may be mounted on semiconductor integrated circuits such as LSIs.

An output control circuit according to a first aspect of the present disclosure includes:
a first amplifier that amplifies a fundamental frequency signal that is inputted from an input terminal;
an N-multiplier that N-multiplies the fundamental frequency signal thus amplified and generates an N-multiplied frequency signal;
a second amplifier that amplifies the N-multiplied frequency signal;
an output terminal via which the N-multiplied frequency signal thus amplified is outputted;
a detector that detects the fundamental frequency signal thus amplified and the N-multiplied frequency signal thus amplified and outputs a first detection signal representing a signal level of the fundamental frequency signal thus amplified and a second detection signal representing a signal level of the N-multiplied frequency signal thus amplified; and a gain control circuit that controls a gain of the first amplifier on a basis of the first detection signal and controls a gain of the second amplifier on a basis of the second detection signal,
wherein the gain control circuit includes
a gain switching controller that changes the respective gains of the first and second amplifiers, and
a comparator that determines, on a basis of the first and second detection signals, whether an operating state of the N-multiplier is a saturated operation or a linear operation,
the comparator determines the operating state of the N-multiplier by comparing an amount of change in the first detection signal with respect to an amount of change in the gain of the first amplifier as changed by the gain switching controller with an amount of change in the second detection signal with respect to the amount of change in the gain of the first amplifier, and
the gain switching controller adjusts the respective gains of the first and second amplifiers on a basis of the operating state thus determined.

An output control circuit according to a second aspect of the present disclosure is the output control circuit according to the first aspect, wherein the gain control circuit includes a temperature detector that detects an ambient temperature of the output control circuit, and
the comparator determines the operating state by comparing an amount of change in the first detection signal with respect to the temperature thus detected with an amount of change in the second detection signal with respect to the temperature thus detected.

An output control circuit according to a third aspect of the present disclosure is the output control circuit according to the first aspect, wherein the gain control circuit includes
a mode determiner that determines whether to perform a calibration mode of calibrating the detector, and
a reference voltage controller that, in a case where the mode determiner determines to perform the calibration mode, switches a power supply voltage of the first amplifier to a predetermined setting voltage, and
in a case where the calibration mode is performed, the reference voltage controller lowers a power supply voltage that is supplied to the first amplifier.

An output control circuit according to a fourth aspect of the present disclosure includes:
a first amplifier that amplifies a fundamental frequency signal that is inputted from an input terminal;
an N-multiplier that N-multiplies the fundamental frequency signal thus amplified;
a distributor circuit that separates a signal that is outputted from the N-multiplier into an impedance-matched fundamental frequency signal and an impedance-matched N-multiplied frequency signal;
a second amplifier that amplifies the impedance-matched N-multiplied frequency signal;
an output terminal via which the N-multiplied frequency signal thus amplified is outputted;
a detector that detects the impedance-matched fundamental frequency signal and the N-multiplied frequency signal thus amplified and outputs a third detection signal representing a signal level of the impedance-matched fundamental frequency signal and a fourth detection signal representing a signal level of the N-multiplied frequency signal thus amplified; and a gain control circuit that controls a gain of the first amplifier on a basis of the third detection signal and controls a gain of the second amplifier on a basis of the fourth detection signal,
wherein the gain control circuit includes
a gain switching controller that changes the respective gains of the first and second amplifiers, and
a comparator that determines, on a basis of the third and fourth detection signals, whether an operating state of the N-multiplier is a saturated operation or a linear operation,
the comparator determines the operating state of the N-multiplier by comparing an amount of change in the third detection signal with respect to an amount of change in the gain of the first amplifier as changed by the gain switching controller with an amount of change in the fourth detection signal with respect to the amount of change in the gain of the first amplifier, and
the gain switching controller adjusts the respective gains of the first and second amplifiers on a basis of the operating state thus determined.

An output control circuit according to a fifth aspect of the present disclosure is the output control circuit according to the fourth aspect, wherein the distributor circuit includes
a first matching circuit that matches a first impedance corresponding to the fundamental frequency signal, and
a second matching circuit that matches a second impedance corresponding to the N-multiplied frequency signal, and
the distributor circuit selects either the fundamental frequency signal or the N-multiplied frequency signal according to the matching of the first impedance by the first matching circuit and the matching of the second impedance by the second matching circuit.

A transmitting device according to a sixth aspect of the present disclosure includes:
an output control circuit including
a first amplifier that amplifies a fundamental frequency signal that is inputted from an input terminal,
an N-multiplier that N-multiplies the fundamental frequency signal thus amplified and generates an N-multiplied frequency signal,
a second amplifier that amplifies the N-multiplied frequency signal,
an output terminal via which the N-multiplied frequency signal thus amplified is outputted,
a detector that detects the fundamental frequency signal thus amplified and the N-multiplied frequency signal thus amplified and outputs a first detection signal representing a signal level of the fundamental frequency signal thus amplified and a second detection signal representing a signal level of the N-multiplied frequency signal thus amplified, and
a gain control circuit that controls a gain of the first amplifier on a basis of the first detection signal and controls a gain of the second amplifier on a basis of the second detection signal,
wherein the gain control circuit includes
a gain switching controller that changes the respective gains of the first and second amplifiers, and
a comparator that determines, on a basis of the first and second detection signals, whether an operating state of the N-multiplier is a saturated operation or a linear operation,
the comparator determines the operating state of the N-multiplier by comparing an amount of change in the first detection signal with respect to an amount of change in the gain of the first amplifier as changed by the gain switching controller with an amount of change in the second detection signal with respect to the amount of change in the gain of the first amplifier, and
the gain switching controller adjusts the respective gains of the first and second amplifiers on a basis of the operating state thus determined;
a local signal output circuit that is connected to the input terminal of the output control circuit, generates a local signal, and outputs the local signal as the fundamental frequency signal to the input terminal;
a mixer that mixes the N-multiplied frequency signal thus amplified that is outputted from the output terminal of the output control circuit and a baseband signal;
a third amplifier that amplifies a mixing signal that is outputted from the mixer; and
a transmitting antenna that transmits the mixing signal thus amplified.

A transmitting device according to a seventh aspect of the present disclosure includes:
an output control circuit including
a fundamental frequency amplifier that amplifies a fundamental frequency signal that is inputted from an input terminal,
an N-multiplier that N-multiplies the fundamental frequency signal thus amplified and generates an N-multiplied frequency signal,
an N-multiplied frequency amplifier that amplifies the N-multiplied frequency signal,
an output terminal via which the N-multiplied frequency signal thus amplified is outputted,
a detector that detects the fundamental frequency signal thus amplified and the N-multiplied frequency signal thus amplified and outputs a first detection signal representing a signal level of the fundamental frequency signal thus amplified and a second detection signal representing a signal level of the N-multiplied frequency signal thus amplified, and
a gain control circuit that controls a gain of the first amplifier on a basis of the first detection signal and controls a gain of the second amplifier on a basis of the second detection signal,
wherein the gain control circuit includes
a gain switching controller that changes the respective gains of the fundamental frequency amplifier and the N-multiplied frequency amplifier, and
a comparator that determines, on a basis of the first and second detection signals, whether an operating state of the N-multiplier is a saturated operation or a linear operation,
the comparator determines the operating state of the N-multiplier by comparing an amount of change in the first detection signal with respect to an amount of change in the gain of the fundamental frequency amplifier as changed by the gain switching controller with an amount of change in the second detection signal with respect to the amount of change in the gain of the fundamental frequency amplifier, and
the gain switching controller adjusts the respective gains of the fundamental frequency amplifier and the N-multiplied frequency amplifier on a basis of the operating state thus determined;
a local signal output circuit generates a local signal;
a mixer that is connected to the input terminal of the output control circuit, mixes the local signal and a baseband signal, and outputs a mixing signal resulting from the mixing as the fundamental frequency signal to the input terminal;

a third amplifier that amplifies the N-multiplied frequency signal thus amplified that is outputted from the output terminal of the output control circuit; and a transmitting antenna that transmits a signal that is outputted from the third amplifier.

A transmitting device according to an eighth aspect of the present disclosure includes:

an output control circuit including
a fundamental frequency amplifier that amplifies a fundamental frequency signal that is inputted from an input terminal,
an N-multiplier that N-multiplies the fundamental frequency signal thus amplified and generates an N-multiplied frequency signal,
an N-multiplied frequency amplifier that amplifies the N-multiplied frequency signal,
an output terminal via which the N-multiplied frequency signal thus amplified is outputted,
a detector that detects the fundamental frequency signal thus amplified and the N-multiplied frequency signal thus amplified and outputs a first detection signal representing a signal level of the fundamental frequency signal thus amplified and a second detection signal representing a signal level of the N-multiplied frequency signal thus amplified, and
a gain control circuit that controls a gain of the first amplifier on a basis of the first detection signal and controls a gain of the second amplifier on a basis of the second detection signal,
wherein the gain control circuit includes
a gain switching controller that changes the respective gains of the fundamental frequency amplifier and the N-multiplied frequency amplifier, and
a comparator that determines, on a basis of the first and second detection signals, whether an operating state of the N-multiplier is a saturated operation or a linear operation,
the comparator determines the operating state of the N-multiplier by comparing an amount of change in the first detection signal with respect to an amount of change in the gain of the fundamental frequency amplifier as changed by the gain switching controller with an amount of change in the second detection signal with respect to the amount of change in the gain of the fundamental frequency amplifier, and
the gain switching controller adjusts the respective gains of the fundamental frequency amplifier and the N-multiplied frequency amplifier on a basis of the operating state thus determined;
a receiving antenna that receives a received signal;
a local signal output circuit that is connected to the input terminal of the output control circuit, generates a local signal, and outputs the local signal as the fundamental frequency signal to the input terminal;
a mixer that mixes the N-multiplied frequency signal thus amplified that is outputted from the output terminal of the output control circuit and the received signal and generates a baseband signal; and a fourth amplifier that amplifies the baseband signal.

Various embodiments have been described above with reference to the drawings. Note, however, that the present disclosure is of course not limited to such examples. It is obvious to a person skilled in the art that various alterations or modifications are conceivable in the scope of claims, and such alterations or modifications are naturally understood as belonging to the technical scope of the present disclosure. Further, the components of the embodiments may be arbitrarily combined, provided such a combination does not depart from the spirit of the disclosure.

Although each of the above embodiments has been described by taking as an example a case where the present disclosure is constituted by hardware, the present disclosure can also be achieved by software in cooperation with hardware.

Further, the functional blocks used in the description of each of the embodiments are typically achieved as LSIs that are integrated circuits each having an input terminal and an output terminal. These functional blocks may be individually in the form of a single chip or may be in the form of a single chip including some or all of them. Although the functional blocks are herein referred to as "LSIs", they may alternatively be referred to as "ICs", "system LSIs", "super LSIs", or "ultra LSIs", depending on their degrees of integration.

Further, the technique of circuit integration is not limited to LSI, but may be achieved by a dedicated circuit or a general-purpose processor. After LSI manufacturing, a programmable FPGA (field programmable gate array) or a reconfigurable processor capable of reconfiguring the connections or settings for circuit cells inside the LSI may be utilized.

Furthermore, if advances in semiconductor technology or other technologies derived therefrom give way to the emergence of a technology of circuit integration that replaces LSI, the functional blocks may of course be integrated using the technology. Adoption of biotechnology or the like can be a possibility.

An output control circuit according to the present disclosure is suitable for use in a communication device that transmits and receives high-frequency signals.

What is claimed is:

1. An output control circuit comprising:
   a first amplifier that amplifies a fundamental frequency signal that is inputted from an input terminal;
   an N-multiplier that N-multiplies the fundamental frequency signal thus amplified and generates an N-multiplied frequency signal;
   a second amplifier that amplifies the N-multiplied frequency signal;
   an output terminal via which the N-multiplied frequency signal thus amplified is outputted;
   a detector that detects the fundamental frequency signal thus amplified and the N-multiplied frequency signal thus amplified and outputs a first detection signal representing a signal level of the fundamental frequency signal thus amplified and a second detection signal representing a signal level of the N-multiplied frequency signal thus amplified; and
   a gain control circuit that controls a gain of the first amplifier on a basis of the first detection signal and controls a gain of the second amplifier on a basis of the second detection signal,
   wherein the gain control circuit includes
      a gain switching controller that changes the respective gains of the first and second amplifiers, and
      a comparator that determines, on a basis of the first and second detection signals, whether an operating state of the -multiplier is a saturated operation or a linear operation,
   the comparator determines the operating state of the N-multiplier by comparing an amount of change in the first detection signal with respect to an amount of change in the gain of the first amplifier as changed by the gain switching controller with an amount of change in the second detection signal with respect to the amount of change in the gain of the first amplifier, and the gain switching controller adjusts the respective gains of the first and second amplifiers on a basis of the operating state thus determined.

2. The output control circuit according to claim 1, wherein the gain control circuit includes a temperature detector that detects an ambient temperature of the output control circuit, and the comparator determines the operating state by comparing an amount of change in the first detection signal with respect to the temperature thus detected with an amount of change in the second detection signal with respect to the temperature thus detected.

3. The output control circuit according to claim 1, wherein the gain control circuit includes a mode determiner that determines whether to perform a calibration mode of calibrating the detector, and a reference voltage controller that, in a case where the mode determiner determines to perform the calibration mode, switches a power supply voltage of the first amplifier to a predetermined setting voltage, and in a case where the calibration mode is performed, the reference voltage controller lowers a power supply voltage that is supplied to the first amplifier.

4. An output control circuit comprising:

a first amplifier that amplifies a fundamental frequency signal that is inputted from an input terminal;

an N-multiplier that N-multiplies the fundamental frequency signal thus amplified;

a distributor circuit that separates a signal that is outputted from the N-multiplier into an impedance-matched fundamental frequency signal and an impedance-matched N-multiplied frequency signal;

a second amplifier that amplifies the impedance-matched N-multiplied frequency signal;

an output terminal via which the N-multiplied frequency signal thus amplified is outputted;

a detector that detects the impedance-matched fundamental frequency signal and the N-multiplied frequency signal thus amplified and outputs a third detection signal representing a signal level of the impedance-matched fundamental frequency signal and a fourth detection signal representing a signal level of the N-multiplied frequency signal thus amplified; and a gain control circuit that controls a gain of the first amplifier on a basis of the third detection signal and controls a gain of the second amplifier on a basis of the fourth detection signal, wherein the gain control circuit includes a gain switching controller that changes the respective gains of the first and second amplifiers, and a comparator that determines, on a basis of the third and fourth detection signals, whether an operating state of the N-multiplier is a saturated operation or a linear operation, the comparator determines the operating state of the N-multiplier by comparing an amount of change in the third detection signal with respect to an amount of change in the gain of the first amplifier as changed by the gain switching controller with an amount of change in the fourth detection signal with respect to the amount of change in the gain of the first amplifier, and the gain switching controller adjusts the respective gains of the first and second amplifiers on a basis of the operating state thus determined.

5. The output control circuit according to claim 4, wherein the distributor circuit includes a first matching circuit that matches a first impedance corresponding to the fundamental frequency signal, and a second matching circuit that matches a second impedance corresponding to the N-multiplied frequency signal, and the distributor circuit selects either the fundamental frequency signal or the N-multiplied frequency signal according to the matching of the first impedance by the first matching circuit and the matching of the second impedance by the second matching circuit.

6. A transmitting device comprising:

an output control circuit including a first amplifier that amplifies a fundamental frequency signal that is inputted from an input terminal, an N-multiplier that N-multiplies the fundamental frequency signal thus amplified and generates an N-multiplied frequency signal, a second amplifier that amplifies the N-multiplied frequency signal, an output terminal via which the N-multiplied frequency signal thus amplified is outputted, a detector that detects the fundamental frequency signal thus amplified and the N-multiplied frequency signal thus amplified and outputs a first detection signal representing a signal level of the fundamental frequency signal thus amplified and a second detection signal representing a signal level of the N-multiplied frequency signal thus amplified, and a gain control circuit that controls a gain of the first amplifier on a basis of the first detection signal and controls a gain of the second amplifier on a basis of the second detection signal, wherein the gain control circuit includes a gain switching controller that changes the respective gains of the first and second amplifiers, and a comparator that determines, on a basis of the first and second detection signals, whether an operating state of the N-multiplier is a saturated operation or a linear operation, the comparator determines the operating state of the N-multiplier by comparing an amount of change in the first detection signal with respect to an amount of change in the gain of the first amplifier as changed by the gain switching controller with an amount of change in the second detection signal with respect to the amount of change in the gain of the first amplifier, and the gain switching controller adjusts the respective gains of the first and second amplifiers on a basis of the operating state thus determined;

a local signal output circuit that is connected to the input terminal of the output control circuit, generates a local signal, and outputs the local signal as the fundamental frequency signal to the input terminal;

a mixer that mixes the N-multiplied frequency signal thus amplified that is outputted from the output terminal of the output control circuit and a baseband signal;

a third amplifier that amplifies a mixing signal that is outputted from the mixer; and a transmitting antenna that transmits the mixing signal thus amplified.

7. A transmitting device comprising:
an output control circuit including
- a fundamental frequency amplifier that amplifies a fundamental frequency signal that is inputted from an input terminal,
- an N-multiplier that N-multiplies the fundamental frequency signal thus amplified and generates an N-multiplied frequency signal,
- an N-multiplied frequency amplifier that amplifies the N-multiplied frequency signal,
- an output terminal via which the N-multiplied frequency signal thus amplified is outputted,
- a detector that detects the fundamental frequency signal thus amplified and the N-multiplied frequency signal thus amplified and outputs a first detection signal representing a signal level of the fundamental frequency signal thus amplified and a second detection signal representing a signal level of the N-multiplied frequency signal thus amplified, and
- a gain control circuit that controls a gain of the first amplifier on a basis of the first detection signal and controls a gain of the second amplifier on a basis of the second detection signal,
- wherein the gain control circuit includes
  - a gain switching controller that changes the respective gains of the fundamental frequency amplifier and the N-multiplied frequency amplifier, and
  - a comparator that determines, on a basis of the first and second detection signals, whether an operating state of the N-multipliedr is a saturated operation or a linear operation,
- the comparator determines the operating state of the N-multiplier by comparing an amount of change in the first detection signal with respect to an amount of change in the gain of the fundamental frequency amplifier as changed by the gain switching controller with an amount of change in the second detection signal with respect to the amount of change in the gain of the fundamental frequency amplifier, and
- the gain switching controller adjusts the respective gains of the fundamental frequency amplifier and the N-multiplied frequency amplifier on a basis of the operating state thus determined;

a local signal output circuit generates a local signal;
a mixer that is connected to the input terminal of the output control circuit, mixes the local signal and a baseband signal, and outputs a mixing signal resulting from the mixing as the fundamental frequency signal to the input terminal;
a third amplifier that amplifies the N-multiplied frequency signal thus amplified that is outputted from the output terminal of the output control circuit; and
a transmitting antenna that transmits a signal that is outputted from the third amplifier.

8. A receiving device comprising:
an output control circuit including
- a fundamental frequency amplifier that amplifies a fundamental frequency signal that is inputted from an input terminal,
- an N-multiplier that N-multiplies the fundamental frequency signal thus amplified and generates an N-multiplied frequency signal,
- an N-multiplied frequency amplifier that amplifies the N-multiplied frequency signal,
- an output terminal via which the N-multiplied frequency signal thus amplified is outputted,
- a detector that detects the fundamental frequency signal thus amplified and the N-multiplied frequency signal thus amplified and outputs a first detection signal representing a signal level of the fundamental frequency signal thus amplified and a second detection signal representing a signal level of the N-multiplied frequency signal thus amplified, and
- a gain control circuit that controls a gain of the first amplifier on a basis of the first detection signal and controls a gain of the second amplifier on a basis of the second detection signal,
- wherein the gain control circuit includes
  - a gain switching controller that changes the respective gains of the fundamental frequency amplifier and the N-multiplied frequency amplifier, and
  - a comparator that determines, on a basis of the first and second detection signals, whether an operating state of the N-multiplier is a saturated operation or a linear operation,
- the comparator determines the operating state of the N-multiplier by comparing an amount of change in the first detection signal with respect to an amount of change in the gain of the fundamental frequency amplifier as changed by the gain switching controller with an amount of change in the second detection signal with respect to the amount of change in the gain of the fundamental frequency amplifier, and
- the gain switching controller adjusts the respective gains of the fundamental frequency amplifier and the N-multiplied frequency amplifier on a basis of the operating state thus determined;

a receiving antenna that receives a received signal;
a local signal output circuit that is connected to the input terminal of the output control circuit, generates a local signal, and outputs the local signal as the fundamental frequency signal to the input terminal;
a mixer that mixes the N-multiplied frequency signal thus amplified that is outputted from the output terminal of the output control circuit and the received signal and generates a baseband signal; and
a fourth amplifier that amplifies the baseband signal.

* * * * *